(12) United States Patent
Machida et al.

(10) Patent No.: US 10,704,838 B2
(45) Date of Patent: Jul. 7, 2020

(54) LOOP HEAT PIPE

(71) Applicant: SHINKO ELECTRIC INDUSTRIES CO., LTD., Nagano (JP)

(72) Inventors: Yoshihiro Machida, Nagano (JP); Nobuyuki Kurashima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 76 days.

(21) Appl. No.: 15/678,346

(22) Filed: Aug. 16, 2017

(65) Prior Publication Data

US 2018/0058767 A1    Mar. 1, 2018

(30) Foreign Application Priority Data

Sep. 1, 2016 (JP) .................................. 2016-170689

(51) Int. Cl.
*F28D 15/04* (2006.01)
*F28D 15/02* (2006.01)
(Continued)

(52) U.S. Cl.
CPC ....... *F28D 15/043* (2013.01); *F28D 15/0233* (2013.01); *F28D 15/0266* (2013.01);
(Continued)

(58) Field of Classification Search
CPC .. F28D 15/043; F28D 15/046; F28D 15/0266; F28D 15/0233; H01L 21/4882; H01L 23/427
See application file for complete search history.

(56) References Cited

U.S. PATENT DOCUMENTS 8,534,348 B2 *   9/2013   Ohsawa ................. B23P 15/26
                                              165/104.26
8,596,341 B2 *  12/2013   Tegrotenhuis .......... F25B 37/00
                                              165/104.26
(Continued)

FOREIGN PATENT DOCUMENTS

JP    H03-209859       9/1991
JP    2002-327993     11/2002
(Continued)

OTHER PUBLICATIONS

Extended European Search Report dated Feb. 27, 2018 issued with respect to the corresponding European Patent Application No. 17187606.3.
(Continued)

*Primary Examiner* — Devon Russell
(74) *Attorney, Agent, or Firm* — IPUSA, PLLC

(57) ABSTRACT

A loop heat pipe includes an evaporator that vaporizes working fluid; a condenser that condenses the working fluid; a liquid line that connects the evaporator and the condenser; a vapor line that connects the evaporator and the condenser to form a loop with the liquid line; and a porous body provided in the liquid line, and including a first metal layer that includes a first bottomed hole that is concaved from one surface of the first metal layer, and a second bottomed hole that is concaved from another surface of the first metal layer, the other surface being opposite of the one surface, the first bottomed hole and the second bottomed hole partially communicating with each other to form a pore.

10 Claims, 16 Drawing Sheets

(51) Int. Cl.
*H01L 21/48* (2006.01)
*H01L 23/427* (2006.01)
*H01L 23/00* (2006.01)

(52) U.S. Cl.
CPC ........ *F28D 15/046* (2013.01); *H01L 21/4882* (2013.01); *H01L 23/427* (2013.01); *H01L 24/16* (2013.01); *H01L 2224/16225* (2013.01); *H01L 2924/1432* (2013.01)

(56) References Cited

U.S. PATENT DOCUMENTS

| | | | |
|---|---|---|---|
| 8,611,089 B2 | 12/2013 | Mizuta et al. | |
| 9,257,365 B2* | 2/2016 | Joshi | H01L 23/4336 |
| 2002/0179284 A1 | 12/2002 | Joshi et al. | |
| 2005/0230085 A1* | 10/2005 | Valenzuela | F28D 15/0233 |
| | | | 165/104.26 |
| 2007/0163755 A1* | 7/2007 | Kim | H01L 23/427 |
| | | | 165/104.26 |
| 2007/0240860 A1* | 10/2007 | Meyer, IV | F28D 15/0233 |
| | | | 165/104.26 |
| 2008/0169087 A1* | 7/2008 | Downing | F28D 15/0233 |
| | | | 165/80.4 |
| 2009/0032226 A1 | 2/2009 | Huang et al. | |
| 2010/0326632 A1* | 12/2010 | Nagai | F28D 15/0233 |
| | | | 165/104.26 |
| 2016/0245593 A1* | 8/2016 | Rice | F28D 15/0266 |
| 2016/0259383 A1* | 9/2016 | Shioga | F28D 15/0266 |

FOREIGN PATENT DOCUMENTS

| | | | |
|---|---|---|---|
| JP | 2009-236362 | 10/2009 | |
| JP | 2011-242061 | 12/2011 | |
| JP | 2015-094490 | 5/2015 | |
| JP | 2015-183880 | 10/2015 | |
| WO | 2015/087451 | 6/2015 | |
| WO | WO-2015087451 A1 * | 6/2015 | ......... F28D 15/0266 |

OTHER PUBLICATIONS

Office Action dated Oct. 16, 2018 issued with respect to the corresponding European Patent Application No. 17187606.3.

* cited by examiner

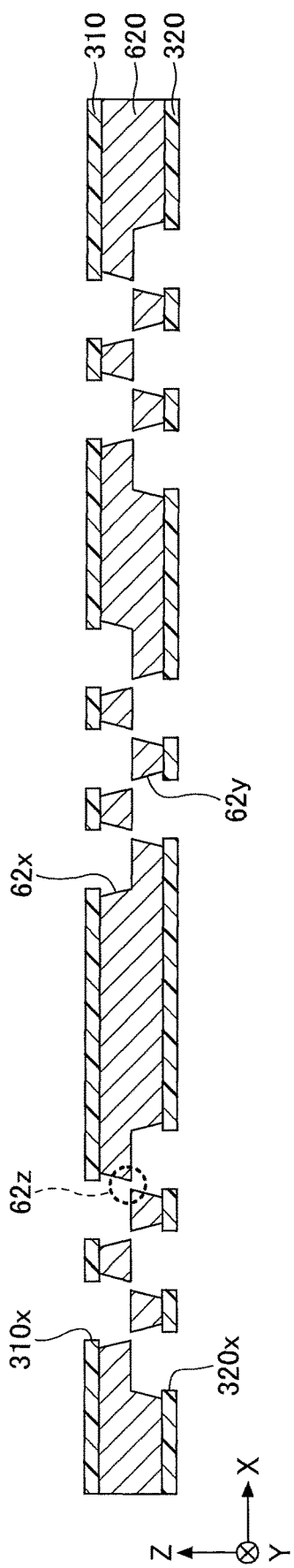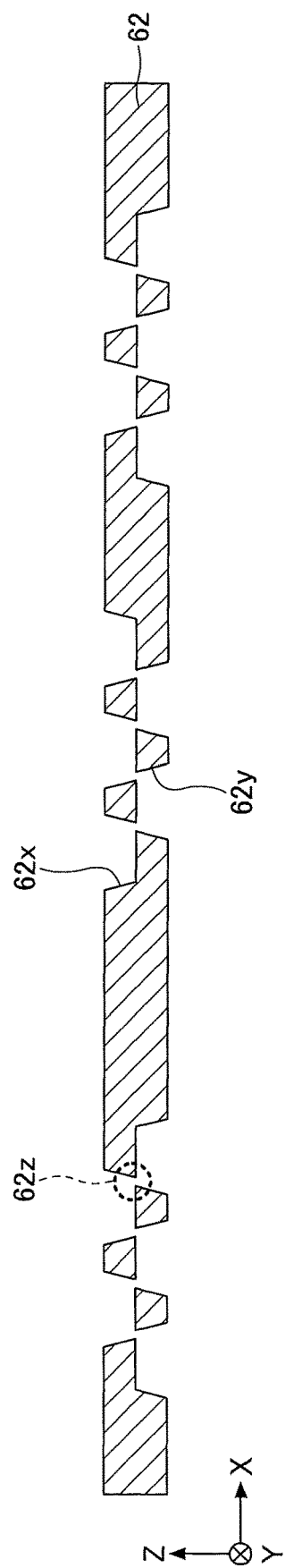

LOOP HEAT PIPE

CROSS-REFERENCE TO RELATED APPLICATIONS

The present application is based on and claims the benefit of priority of Japanese Priority Application No. 2016-170689 filed on Sep. 1, 2016, the entire contents of which are hereby incorporated by reference.

FIELD

The present invention relates to a loop heat pipe.

BACKGROUND

As a device to cool a heating component such as a Central Processing Unit (CPU) mounted on an electronic device, a heat pipe is known. The heat pipe is a device that transports heat using phase change of working fluid.

As an example of a heat pipe, a loop heat pipe may be raised which includes an evaporator that vaporizes working fluid by heat of a heating component and a condenser that condenses the vaporized working fluid. In the loop heat pipe, the evaporator and the condenser are connected by a liquid line and a vapor line that form a loop flow path. In the loop heat pipe, the working fluid flows in the loop flow path in one direction.

Further, a porous body is provided in the liquid line of the loop heat pipe so that the working fluid in the liquid line is induced to the evaporator by capillary force generated in the porous body and vapor is prevented from reversely flowing from the evaporator to the liquid line. A plurality of pores are formed in the porous body. Each of the pores is formed by stacking a plurality of metal layers in each of which through holes are formed such that the through holes of different metal layers partially overlap (see Patent Document 1, for example).

However, it is difficult to stack the metal layers, in each of which the through holes are formed, such that the through holes of different metal layers partially overlap for all of the pores, for the following reasons. First, a positional shift of the metal layers may occur when stacking the plurality of metal layers. Second, a positional shift may occur due to expansion and contraction of the metal layers when heating the metal layers while stacking the metal layers. Third, positional shifts of the through holes occur when forming the through holes in each of the metal layers.

If such positional shifts occur, pores each having a predetermined size cannot be formed, and capillary force generated by the pores is lowered. Thus, an effect of suppressing a backflow of vapor from an evaporator to a liquid line cannot be sufficiently obtained.

[Patent Document]
[Patent Document 1] WO 2015/087451

SUMMARY

The present invention is made in light of the above problems, and provides a loop heat pipe including a porous body whose capillary force generated by pores is improved.

According to an embodiment, there is provided a loop heat pipe including an evaporator that vaporizes working fluid; a condenser that condenses the working fluid; a liquid line that connects the evaporator and the condenser; a vapor line that connects the evaporator and the condenser to form a loop with the liquid line; and a porous body provided in the liquid line, and including a first metal layer that includes a first bottomed hole that is concaved from one surface of the first metal layer, and a second bottomed hole that is concaved from another surface of the first metal layer, the other surface being opposite of the one surface, the first bottomed hole and the second bottomed hole partially communicating with each other to form a pore.

BRIEF DESCRIPTION OF DRAWINGS

Other objects, features and advantages of the present invention will become more apparent from the following detailed description when read in conjunction with the accompanying drawings.

FIG. 5A to FIG. 5D are views illustrating an example of manufacturing steps of the loop heat pipe of the first embodiment;

DESCRIPTION OF EMBODIMENTS

The invention will be described herein with reference to illustrative embodiments. Those skilled in the art will recognize that many alternative embodiments can be accomplished using the teachings of the present invention and that the invention is not limited to the embodiments illustrated for explanatory purposes.

First Embodiment (Structure of Loop Heat Pipe of First Embodiment)

Figure 1:
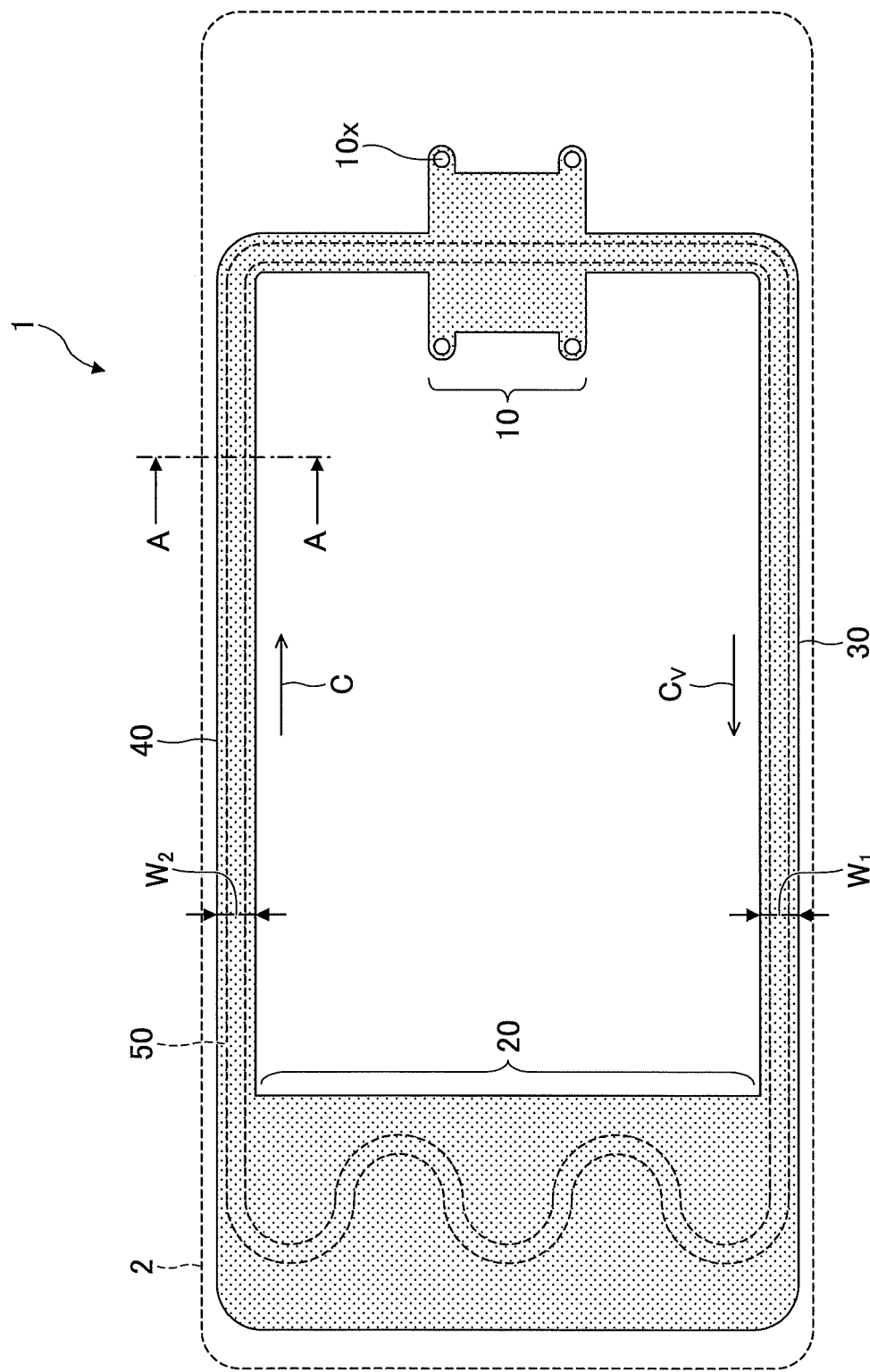
FIG. 1 is a plane view schematically illustrating an example of a loop heat pipe of a first embodiment.

First, a structure of a loop heat pipe of a first embodiment is described. FIG. 1 is a plane view schematically illustrating an example of a loop heat pipe 1 of the first embodiment.

With reference to FIG. 1, the loop heat pipe 1 includes an evaporator 10, a condenser 20, a vapor line 30 and a liquid line 40. The loop heat pipe 1 may be included in a mobile electronic device 2 such as, for example, a smartphone or a tablet terminal.

In the loop heat pipe 1, the evaporator 10 has a function to generate vapor Cv by vaporizing working fluid C. The condenser 20 has a function to condense (liquidize) the vapor Cv of the working fluid C. The evaporator 10 and the condenser 20 are connected by the vapor line 30 and the liquid line 40, and a flow path 50, which is a loop, through which the working fluid C or the vapor Cv flows is formed by the vapor line 30 and the liquid line 40.

Figure 2:
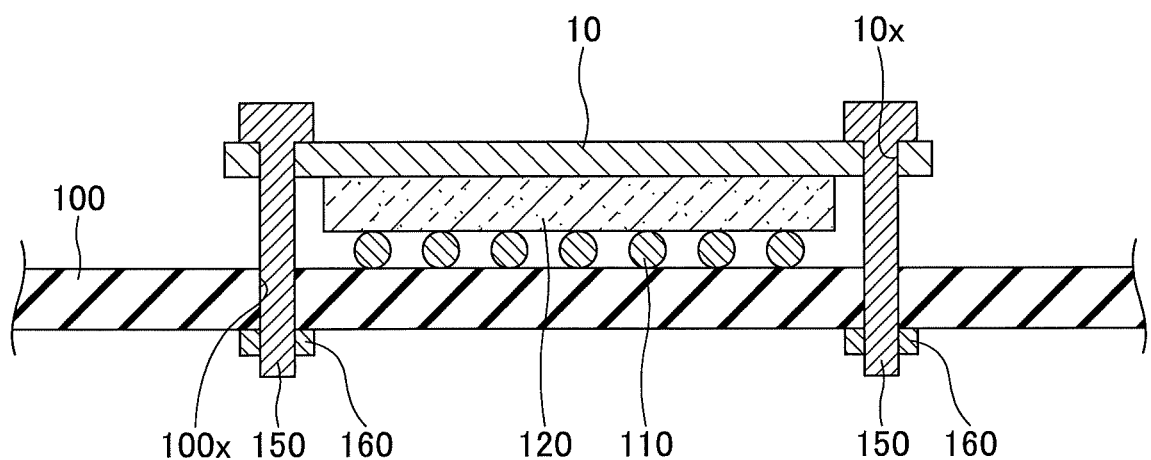
FIG. 2 is a cross-sectional view illustrating an evaporator and its surrounding of the loop heat pipe of the first embodiment.

FIG. 2 is a cross-sectional view illustrating the evaporator 10 and its surrounding of the loop heat pipe 1 of the first embodiment. As illustrated in FIG. 1 and FIG. 2, four through holes 10x, for example, are formed in the evaporator 10. The evaporator 10 is fixed to a circuit board 100 by inserting bolts 150 in the through holes 10x formed in the evaporator 10 and through holes 100x formed in the circuit board 100, and fixing by nuts 160 from a lower surface of the circuit board 100, respectively.

A heating component 120 such as a CPU, for example, is mounted on the circuit board 100 via bumps 110, and an upper surface of the heating component 120 closely contacts a lower surface of the evaporator 10. The working fluid C in the evaporator 10 is vaporized by heat generated at the heating component 120, and the vapor Cv is generated.

As illustrated in FIG. 1, the vapor Cv generated in the evaporator 10 is led to the condenser 20 via the vapor line 30 and is condensed (liquidized) at the condenser 20. With this, the heat generated at the heating component 120 moves to the condenser 20, and rise of temperature at the heating component 120 is suppressed. The working fluid C condensed at the condenser 20 is led to the evaporator 10 via the liquid line 40. The width $W_1$ of the vapor line 30 may be, for example, approximately 8 mm. The width $W_2$ of the liquid line 40 may be, for example, approximately 6 mm.

Although the type of the working fluid C is not specifically limited, in order to efficiently cool the heating component 120 by latent heat of vaporization, it is preferable to use fluid whose vapor pressure is high as well as whose latent heat of vaporization is large. For such fluid, for example, ammonia, water, fluorocarbon, alcohol and acetone may be raised.

The evaporator 10, the condenser 20, the vapor line 30 and the liquid line 40 may be, for example, a structure in which a plurality of metal layers are stacked. The metal layers are, for example, copper layers having good thermal conductivity, and directly bonded by solid-phase welding or the like. The thickness of each of the metal layers may be, for example, approximately 50 µm to 200 µm.

The metal layers are not limited to the copper layers, and may be stainless layers, aluminum layers, magnesium alloy layers or the like. The number of the stacked metal layers is not specifically limited.

Figure 3:
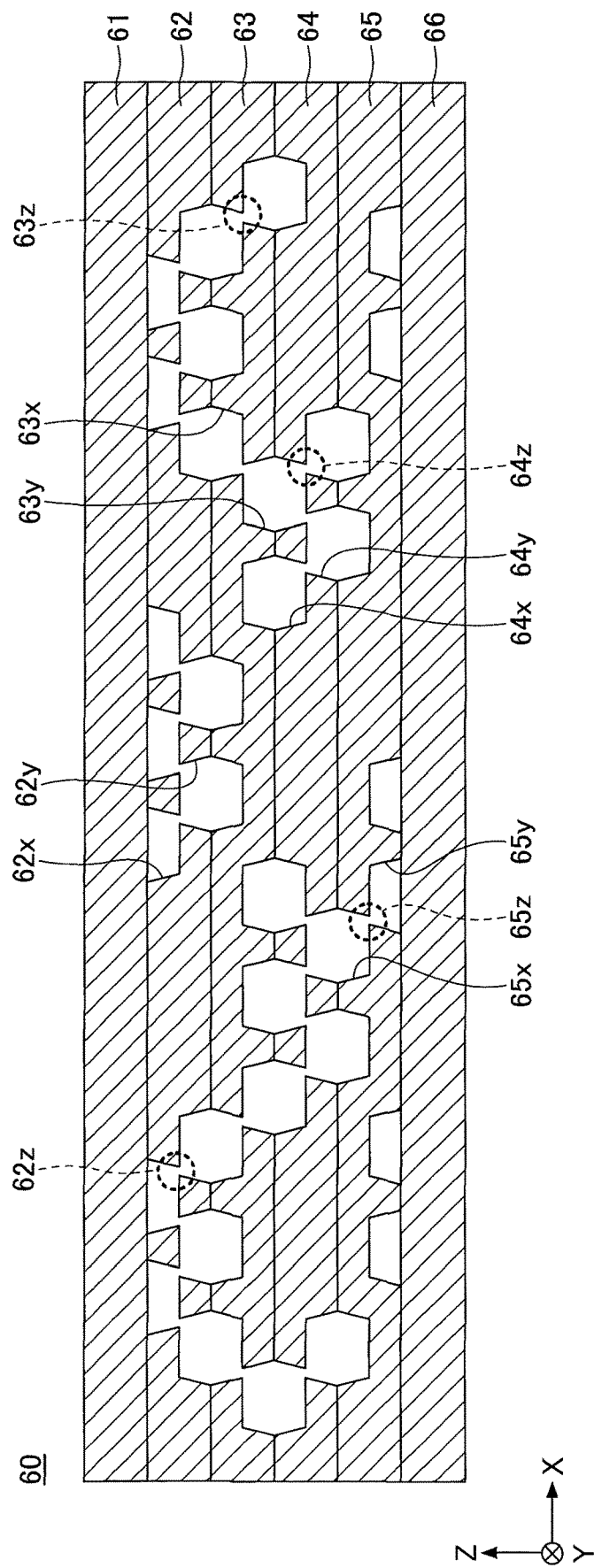
FIG. 3 is a cross-sectional view (No. 1) illustrating an example of a porous body provided in a liquid line.
Figure 4:
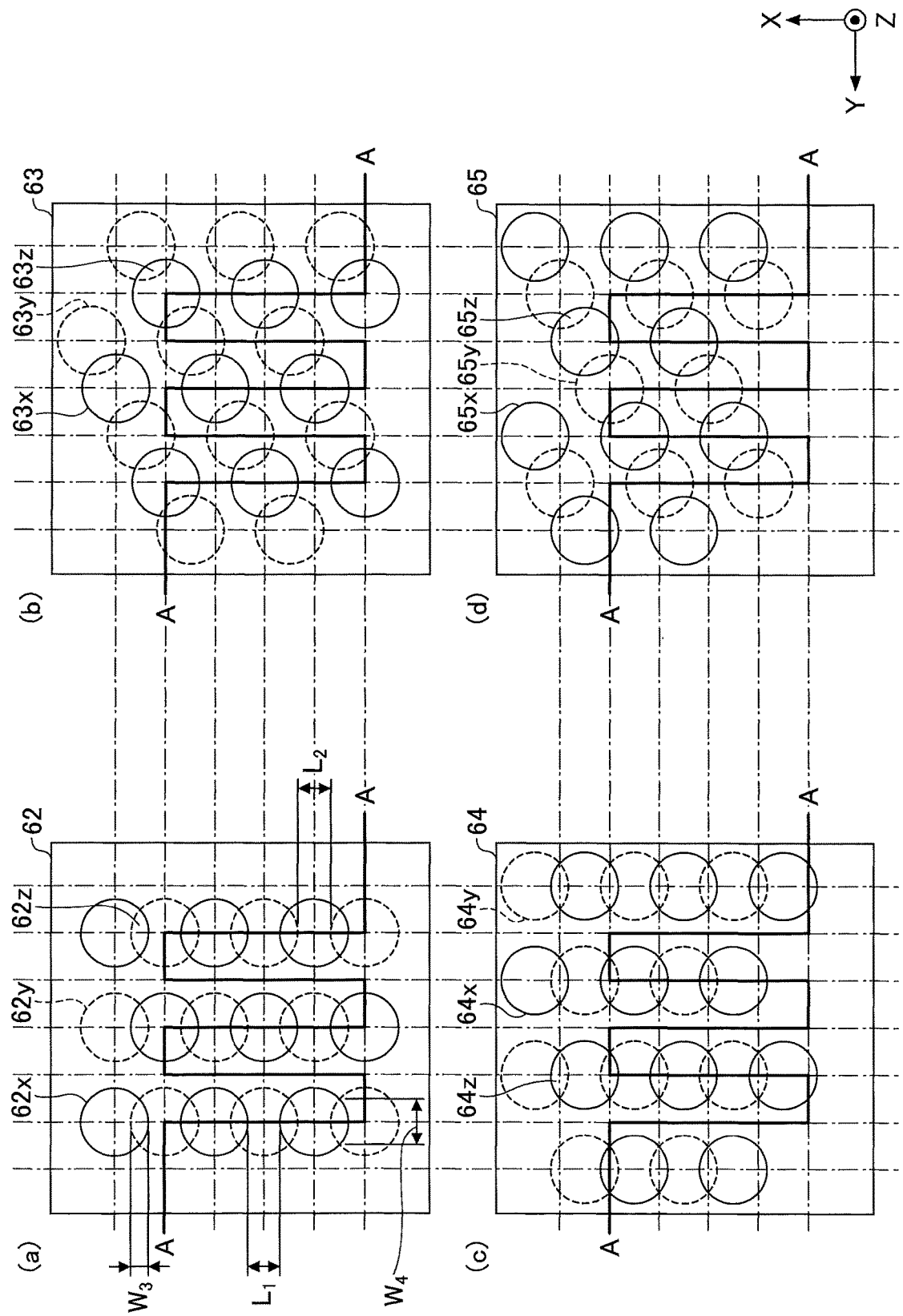
FIG. 4 is a plane view (No. 1) illustrating an example of a layout of bottomed holes in each of second to fifth metal layers of the porous body.

FIG. 3 is a cross-sectional view (No. 1) illustrating an example of a porous body 60 provided in the liquid line 40. FIG. 4 is a plane view (No. 1) illustrating an example of a layout of bottomed holes (i.e., holes having a bottom surface) in each of second to fifth metal layers. Portions illustrated by A-A lines in FIG. 4 correspond to a cross-section of FIG. 3. The A-A line of FIG. 1 roughly illustrates the A-A lines of FIG. 4.

The porous body 60 illustrated in FIG. 3 and FIG. 4 is provided in the liquid line 40. Further, the porous body 60 same as that included in the liquid line 40 is provided in the evaporator 10.

The porous body 60 may have a structure in which, for example, six metal layers, first to sixth metal layers 61 to 66 are stacked. In FIG. 4, (a) illustrates an example of a layout of bottomed holes formed in the second metal layer 62, (b) illustrates an example of a layout of bottomed holes formed in the third metal layer 63, (c) illustrates an example of a layout of bottomed holes formed in the fourth metal layer 64, and (d) illustrates an example of a layout of bottomed holes formed in the fifth metal layer 65.

The metal layers 61 to 66 are, for example, copper layers having good thermal conductivity, and directly bonded with each other by solid-phase welding or the like. The thickness of each of the metal layers 61 to 66 may be, for example, approximately 50 µm to 200 µm. The metal layers 61 to 66 are not limited to the copper layers, and may be stainless layers, aluminum layers, magnesium alloy layers or the like. The number of the stacked metal layers is not specifically limited as well, and 5 or less metal layers, or 7 or more metal layers may be stacked.

In FIG. 3 and FIG. 4, it is assumed that a stacking direction of the metal layers 61 to 66 is a Z direction, a selectable direction in a plane that is perpendicular to the Z direction is an X direction and a direction that is perpendicular to the X direction in the plane is a Y direction (This is the same for following drawings.).

As illustrated in FIG. 3, in the porous body 60, holes or grooves are not provided in each of the first metal layer 61 (first outermost layer) and the sixth metal layer 66 (second outermost layer).

On the other hand, as illustrated in FIG. 3 and (a) of FIG. 4, a plurality of bottomed holes (i.e., holes having a bottom surface) 62x and a plurality of bottomed holes (i.e., holes having a bottom surface) 62y are provided in the second metal layer 62. Each of the bottomed holes 62x is formed to concave (i.e., to be recessed) from an upper surface to a substantially center portion of the second metal layer 62 in the thickness direction. Each of the bottomed holes 62y is formed to concave (i.e., to be recessed) from a lower surface to the substantially center portion of the second metal layer 62 in the thickness direction.

As illustrated in (a) of FIG. 4, the bottomed holes 62x and the bottomed holes 62y are alternately aligned in the X direction, in a planar view. Further, the bottomed holes 62x and the bottomed holes 62y are alternately aligned in the Y direction, in a planar view. Each of the bottomed holes 62x and each of the bottomed holes 62y alternately aligned and adjacent to each other in the X direction partially overlap in a planar view, and overlapping portions are communicating with each other to form a pore 62z (see also FIG. 3). As illustrated in (a) of FIG. 4, there is a predetermined space between each of the bottomed holes 62x and each of the bottomed holes 62y alternately aligned and adjacent to each other in the Y direction, and they do not overlap in a planar view. Thus, a pore is not formed between each of the bottomed holes 62x and each of the bottomed holes 62y alternately aligned and adjacent to each other in the Y direction.

Each of the bottomed holes 62x and 62y may be, for example, a circle whose diameter is approximately 100 to 300 µm, but may have any shapes such as an elliptical shape or a polygonal shape. The depth of each of the bottomed holes 62x and 62y may be, for example, approximately half of the thickness of the metal layer 62. A space $L_1$ between the adjacent bottomed holes 62x may be, for example, approximately 100 to 400 µm. A space $L_2$ between the adjacent bottomed holes 62y may be, for example, approximately 100 to 400 µm.

An inner wall of each of the bottomed holes 62x and 62y may be formed in a tapered shape whose width becomes larger from a bottom surface side to an open portion side. However, this is not limited so, and the inner wall of each of the bottomed holes 62x and 62y may be perpendicular to the bottom surface. A width $W_3$ of the pore 62z in a short direction may be, for example, approximately 10 to 50 µm. Further, a width $W_4$ of the pore 62z in a longitudinal direction may be, for example, approximately 50 to 150 µm.

As illustrated in FIG. 3 and (b) of FIG. 4, a plurality of bottomed holes 63x each being formed to concave from an upper surface to a substantially center portion in the thickness direction, and a plurality of bottomed holes 63y each being formed to concave from a lower surface to the substantially center portion in the thickness direction are formed in the third metal layer 63.

As illustrated in (b) of FIG. 4, in the metal layer 63, a line in which only the bottomed holes 63x are aligned in the X direction, and a line in which only the bottomed holes 63y are aligned in the X direction are alternately aligned in the Y direction. Each of the bottomed holes 63x and each of the bottomed holes 63y in the lines alternately aligned and adjacent to each other in the Y direction partially overlap in a planar view, and overlapping portions are communicating with each other to form a pore 63z (see also FIG. 3).

Here, centers of the adjacent bottomed hole 63x and the bottomed hole 63y that form the pore 63z are shifted in the X direction. In other words, the bottomed hole 63x and the bottomed hole 63y that form the pore 63z are alternately aligned in an oblique direction with respect to the X direction and the Y direction. The shape or the like of each of the bottomed holes 63x and 63y, and the pores 63z may be the same as that of each of the bottomed holes 62x and 62y, and the pores 62z, for example.

The bottomed holes 62y of the metal layer 62 and the bottomed holes 63x of the metal layer 63 are formed to overlap, respectively, in a planar view. Thus, pores are not formed at an interface of the metal layer 62 and the metal layer 63.

As illustrated in FIG. 3 and (c) of FIG. 4, a plurality of bottomed holes 64x each being formed to concave from an upper surface to a substantially center portion in the thickness direction, and a plurality of bottomed holes 64y each being formed to concave from a lower surface to the substantially center portion in the thickness direction are formed in the fourth metal layer 64.

As illustrated in (c) of FIG. 4, the bottomed holes 64x and the bottomed holes 64y are alternately aligned in the X direction, in a planar view. Further, the bottomed holes 64x and the bottomed holes 64y are alternately aligned in the Y direction, in a planar view. Each of the bottomed holes 64x and each of the bottomed holes 64y alternately aligned and adjacent to each other in the X direction partially overlap in a planar view, and overlapping portions are communicating with each other to form a pore 64z (see also FIG. 3). As illustrated in (c) of FIG. 4, there is a predetermined space between each of the bottomed holes 64x and the bottomed holes 64y alternately aligned and adjacent to each other in the Y direction, and they do not overlap in a planar view. Thus, a pore is not formed between each of the bottomed holes 64x and each of the bottomed holes 64y alternately aligned and adjacent to each other in the Y direction. The shape or the like of each of the bottomed holes 64x and 64y, and the pores 64z may be the same as that of each of the bottomed holes 62x and 62y, and the pores 62z, for example.

The bottomed holes 63y of the metal layer 63 and the bottomed holes 64x of the metal layer 64 are formed to overlap, respectively, in a planar view. Thus, pores are not formed at an interface of the metal layer 63 and the metal layer 64.

As illustrated in FIG. 3 and (d) of FIG. 4, a plurality of bottomed holes 65x each being formed to concave from an upper surface to a substantially center portion in the thickness direction, and a plurality of bottomed holes 65y each being formed to concave from a lower surface to the substantially center portion in the thickness direction are formed in the fifth metal layer 65.

As illustrated in (d) of FIG. 4, in the metal layer 65, a line in which only the bottomed holes 65x are aligned in the X direction, and a line in which only the bottomed holes 65y are aligned in the X direction are alternately aligned in the Y direction. Each of the bottomed holes 65x and each of the bottomed holes 65y in the lines alternately aligned and adjacent to each other in the Y direction partially overlap in a planar view, and overlapping portions are communicating with each other to form a pore 65z (see also FIG. 3).

Here, centers of the adjacent bottomed hole 65x and the bottomed hole 65y that form the pore 65z are shifted in the X direction. In other words, the bottomed hole 65x and the bottomed hole 65y that form the pore 65z are alternately aligned in an oblique direction with respect to the X direction and the Y direction. The shape or the like of each of the bottomed holes 65x and 65y, and the pores 65z may be the same as that of each of the bottomed holes 62x and 62y, and the pores 62z, for example.

The bottomed holes 64y of the metal layer 64 and the bottomed holes 65x of the metal layer 65 are formed to overlap, respectively, in a planar view. Thus, pores are not formed at an interface of the metal layer 64 and the metal layer 65.

The pores formed in each of the metal layers are communicating with each other, and those pores communicating with each other spread three-dimensionally in the porous body 60. Thus, the working fluid C can spread three-dimensionally in the pores communicating with each other in the porous body 60 by capillary force.

Here, although a position to provide the porous body 60 in the liquid line 40 is not specifically limited, it is preferable that the porous body 60 is provided with a space from a pipe wall of the liquid line 40. With this, the fine flow path 50 through which the working fluid C flows can be formed between the pipe wall and the porous body 60, and the working fluid C can easily flow in the liquid line 40.

As such, the porous body 60 is provided in the liquid line 40, and the porous body 60 is extended to near the evaporator 10 along the liquid line 40. With this, the liquid phase working fluid C in the liquid line 40 is guided to the evaporator 10 by the capillary force generated in the porous body 60.

As a result, even when the vapor Cv tries to flow in a reverse direction in the liquid line 40 due to heat leak or the like from the evaporator 10, the capillary force applied from the porous body 60 to the liquid phase working fluid C can push back the vapor Cv to prevent the backflow of the vapor Cv.

Further, the porous body 60 is provided in the evaporator 10 as well. The liquid phase working fluid C permeates a portion of the porous body 60 in the evaporator 10 near the liquid line 40. At this time, the capillary force that is applied from the porous body 60 to the working fluid C becomes pumping force that circulates the working fluid C in the loop heat pipe 1.

Further, as the capillary force copes against the vapor Cv in the evaporator 10, backflow of the vapor Cv to the liquid line 40 can be suppressed.

Here, although an inlet (not illustrated in the drawings) for introducing the working fluid C is provided at the liquid line 40, the inlet is sealed by a sealing member, and the loop heat pipe 1 is kept air tight.

(Method of Manufacturing Loop Heat Pipe of First Embodiment)

Next, a method of manufacturing the loop heat pipe 1 of the first embodiment is described, in which manufacturing steps of the porous body 60 is mainly described. FIG. 5A to FIG. 6B are views illustrating an example of manufacturing steps of the loop heat pipe 1 of the first embodiment, and illustrate cross-sections corresponding to FIG. 3.

Figure 5A:
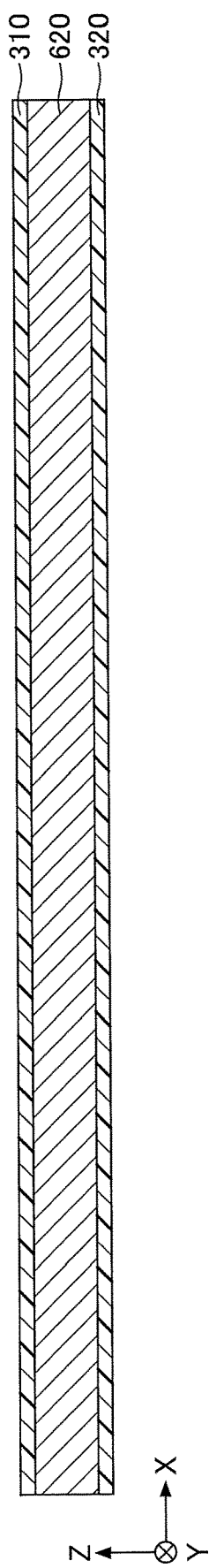

First, in a step illustrated in FIG. 5A, a metal sheet 620 having a planar shape as illustrated in FIG. 1 is prepared. Then, a resist layer 310 and a resist layer 320 are formed at an upper surface and a lower surface of the metal sheet 620, respectively. The metal sheet 620 is a member that becomes the metal layer 62 at last, and may be made of copper, stainless, aluminum, magnesium alloy or the like, for example. The thickness of the metal sheet 620 may be, for example, approximately 50 μm to 200 μm. As the resist layers 310 and 320, for example, a photosensitive dry film resist or the like may be used.

Figure 5B:
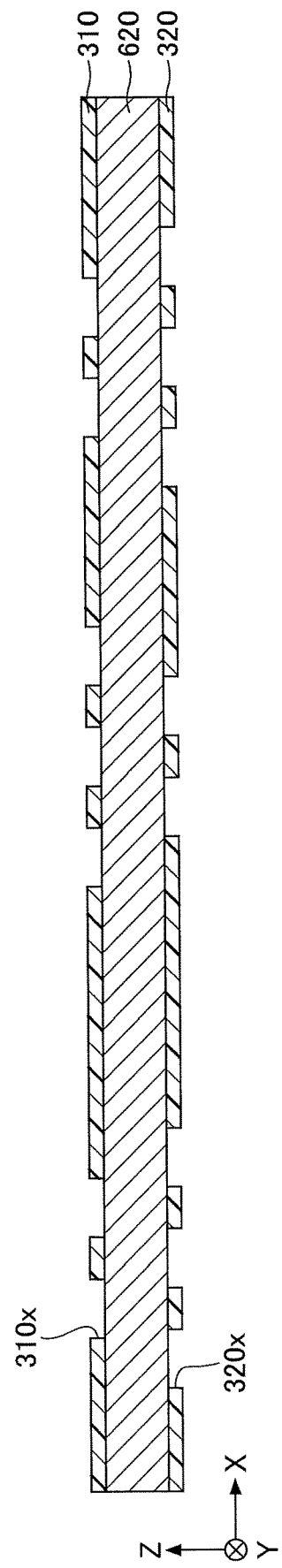

Next, in a step illustrated in FIG. 5B, by exposing and developing the resist layer 310, open portions 310x that selectively expose the upper surface of the metal sheet 620 are formed in the resist layer 310 at an area of the metal sheet 620 where the porous body 60 is formed (at an area that becomes the evaporator 10 and the liquid line 40). Further, by exposing and developing the resist layer 320, open portions 320x that selectively expose the lower surface of the metal sheet 620 are formed. Shapes and layouts of the open portions 310x and 320x are provided to correspond to the shapes and the layout of the bottomed holes 62x and 62y illustrated in (a) of FIG. 4, respectively.

Next, in a step illustrated in FIG. 5C, the metal sheet 620 that is exposed in each of the open portions 310x is half-etched from the upper surface of the metal sheet 620, and the metal sheet 620 that is exposed in each of the open portions 320x is half-etched from the lower surface of the metal sheet 620. With this, the bottomed holes 62x are formed at the upper surface of the metal sheet 620, and the bottomed holes 62y are formed at the lower surface of the metal sheet 620. Further, as each of the open portions 310x and each of the open portions 320x that are adjacent to each other in the X direction partially overlap in a planar view, overlapping portions are communicating with each other to form the pore 62z. For half-etching the metal sheet 620, for example, ferric chloride solution may be used.

Next, in a step illustrated in FIG. 5D, the resist layers 310 and 320 are removed by stripping solution. With this, the metal layer 62 is completed.

Figure 6A:
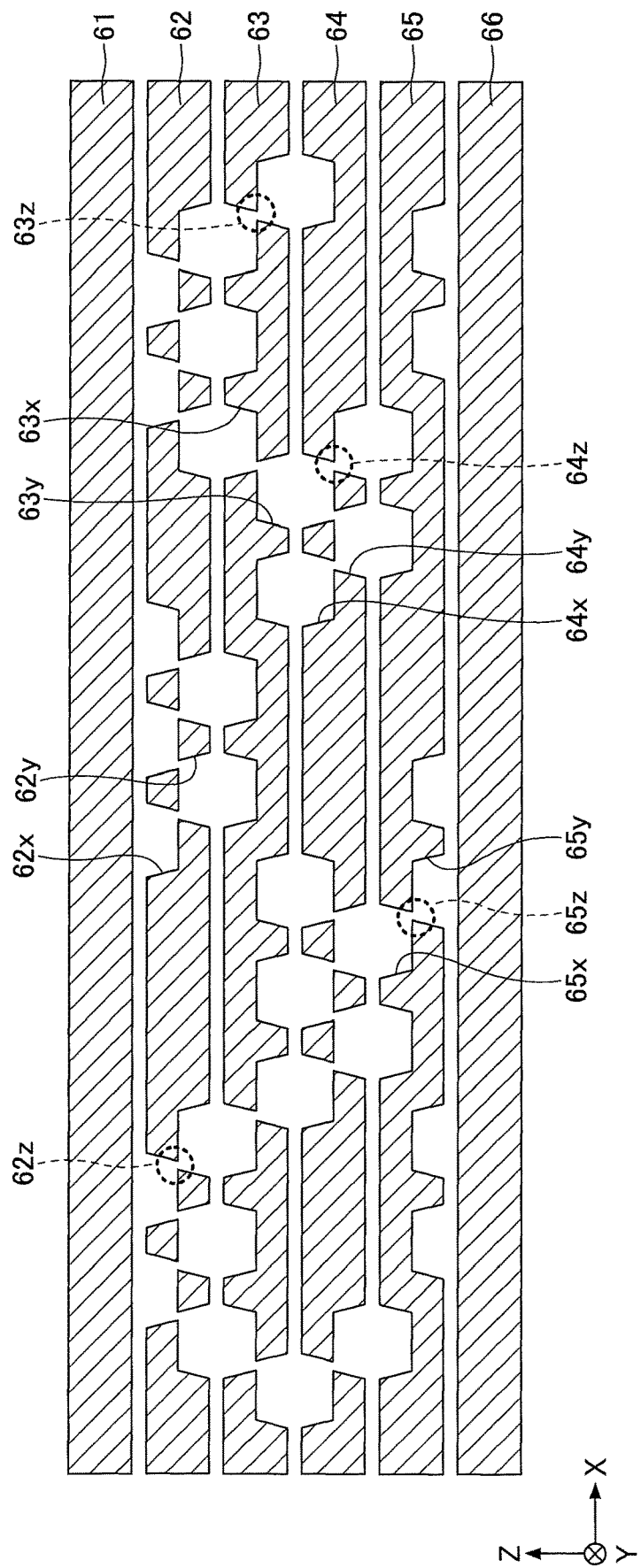
FIG. 6A and FIG. 6B are views illustrating an example of the manufacturing steps of the loop heat pipe of the first embodiment.

Next, in a step illustrated in FIG. 6A, the solid metal layers 61 and 66, in each of which pores and grooves are not formed, are prepared. Further, each of the metal layers 63, 64 and 65 is formed by a method similar to the method of manufacturing the metal layer 62. Positions of the bottomed holes and the pores formed in the metal layers 63, 64 and 65 are as illustrated in FIG. 4, for example.

Figure 6B:
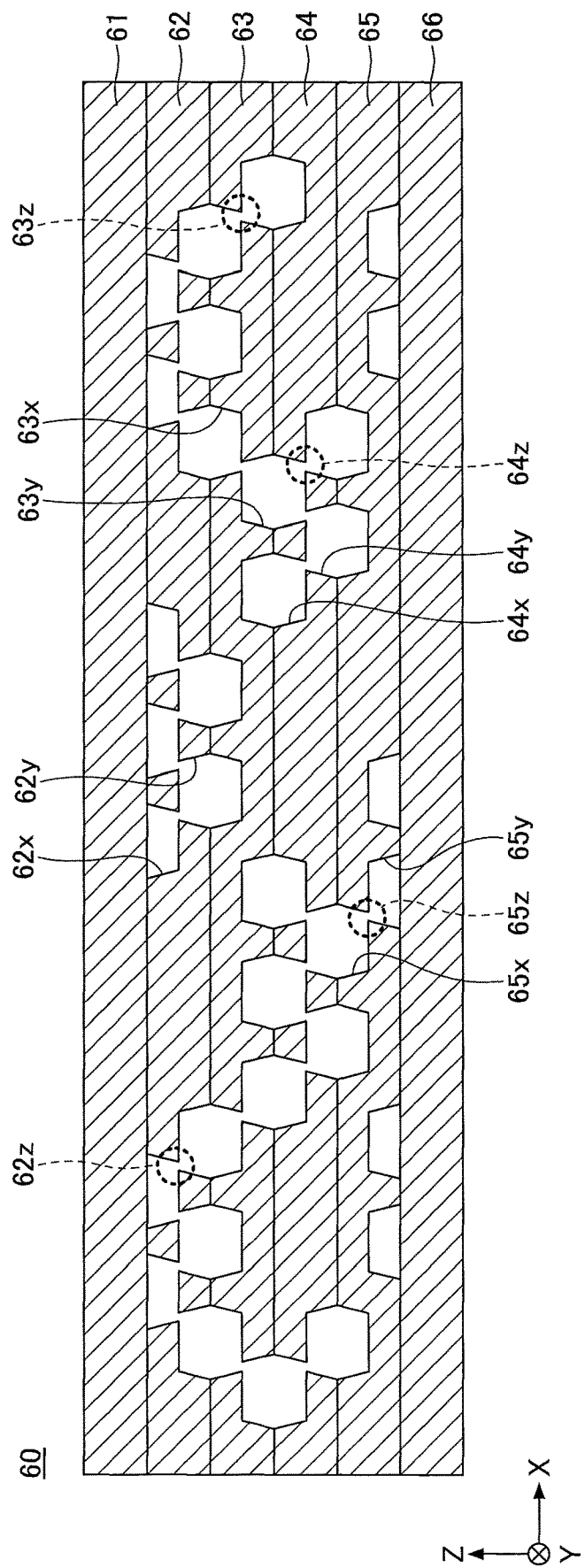

Next, in a step illustrated in FIG. 6B, the metal layers are stacked in order as illustrated in FIG. 6A, and solid-phase welding is performed by pressing and heating. With this, adjacent metal layers are directly bonded, and the loop heat pipe 1 including the evaporator 10, the condenser 20, the vapor line 30 and the liquid line 40 is completed. At this time, the porous body 60 is formed in the evaporator 10 and the liquid line 40. Further, by providing the porous body 60 with a space from the pipe wall of the liquid line 40, the fine flow path 50 through which the working fluid C flows is formed between the pipe wall and the porous body 60. Thereafter, after evacuating the liquid line 40 using a vacuum pump or the like, the working fluid C is introduced from the inlet, not illustrated in the drawings, into the liquid line 40 and the inlet is sealed.

Here, solid-phase welding is a method of bonding objects, by heating the objects under solid phase (solid) states to be softened without melting them, and further applying pressure to bond the objects by plastic deformation. Here, it is preferable that the entire materials of the metal layers 61 to 66 are the same so that the adjacent metal layers can be appropriately bonded by the solid-phase welding.

As such, according to the first embodiment, the pore is provided by forming the bottomed holes from both surfaces of each of the metal layers and partially communicating the bottomed holes. Thus, a problem of the conventional method of forming pores in which metal layers, in each of which through holes are formed, are stacked such that the through holes partially overlap can be solved. In other words, the positional shift when stacking the metal layers, and the positional shift due to expansion and contraction of the metal layers when heating the metal layers while stacking the metal layers do not occur and pores each having a predetermined size can be formed in each of the metal layers.

With this, lowering of the capillary force due to variation in sizes of the pores can be prevented, and the backflow of the vapor Cv from the evaporator 10 to the liquid line 40 can be stably suppressed.

Further, the adjacent metal layers are stacked such that the entirety of the bottomed holes of the adjacent metal layers overlap. Thus, area where the adjacent metal layers contact with each other can be made large and the metal layers can be rigidly bonded.

(Alternative Example 1 of First Embodiment)

In an alternative example 1 of the first embodiment, an example is described in which bottomed holes are also formed in the outermost layers of the porous body of the first embodiment. In the alternative example 1 of the first embodiment, the same components are given the same reference numerals as the above described embodiment, and explanations are not repeated.

Figure 7:
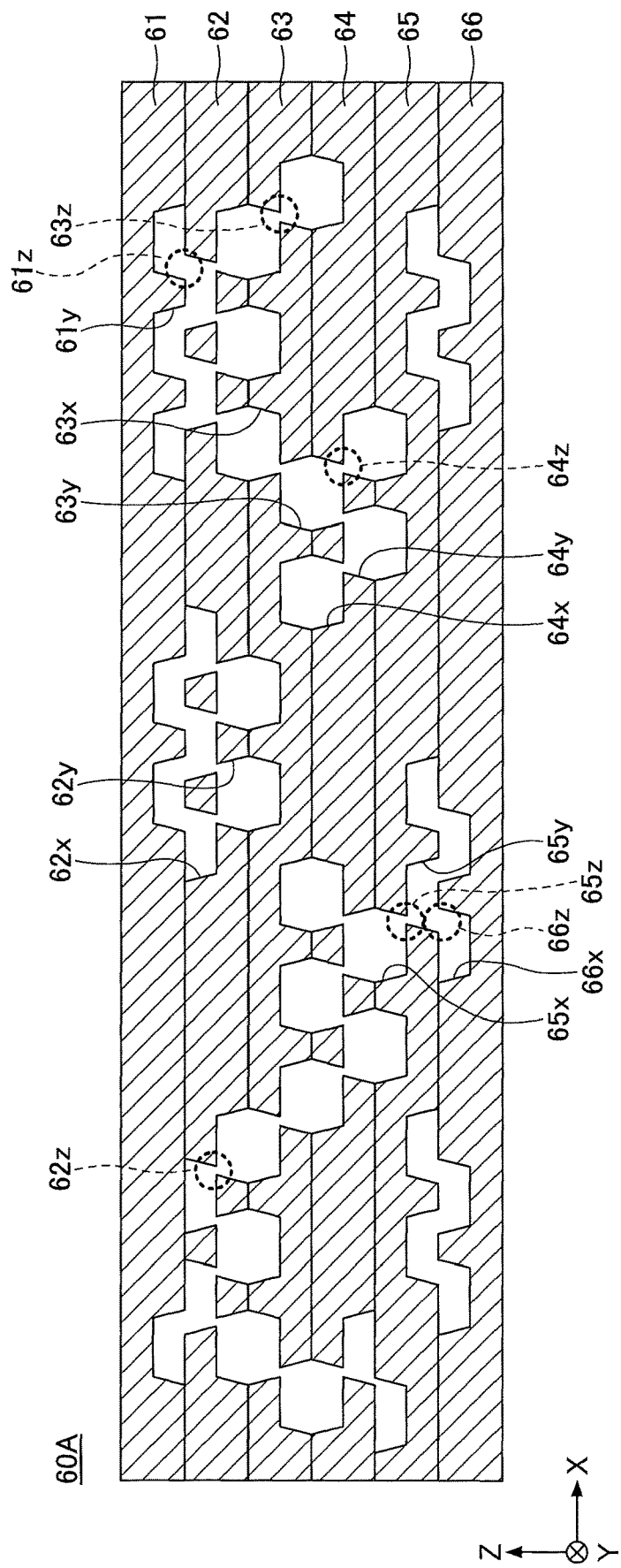
FIG. 7 is a cross-sectional view (No. 2) illustrating an example of the porous body provided in the liquid line.
Figure 8:
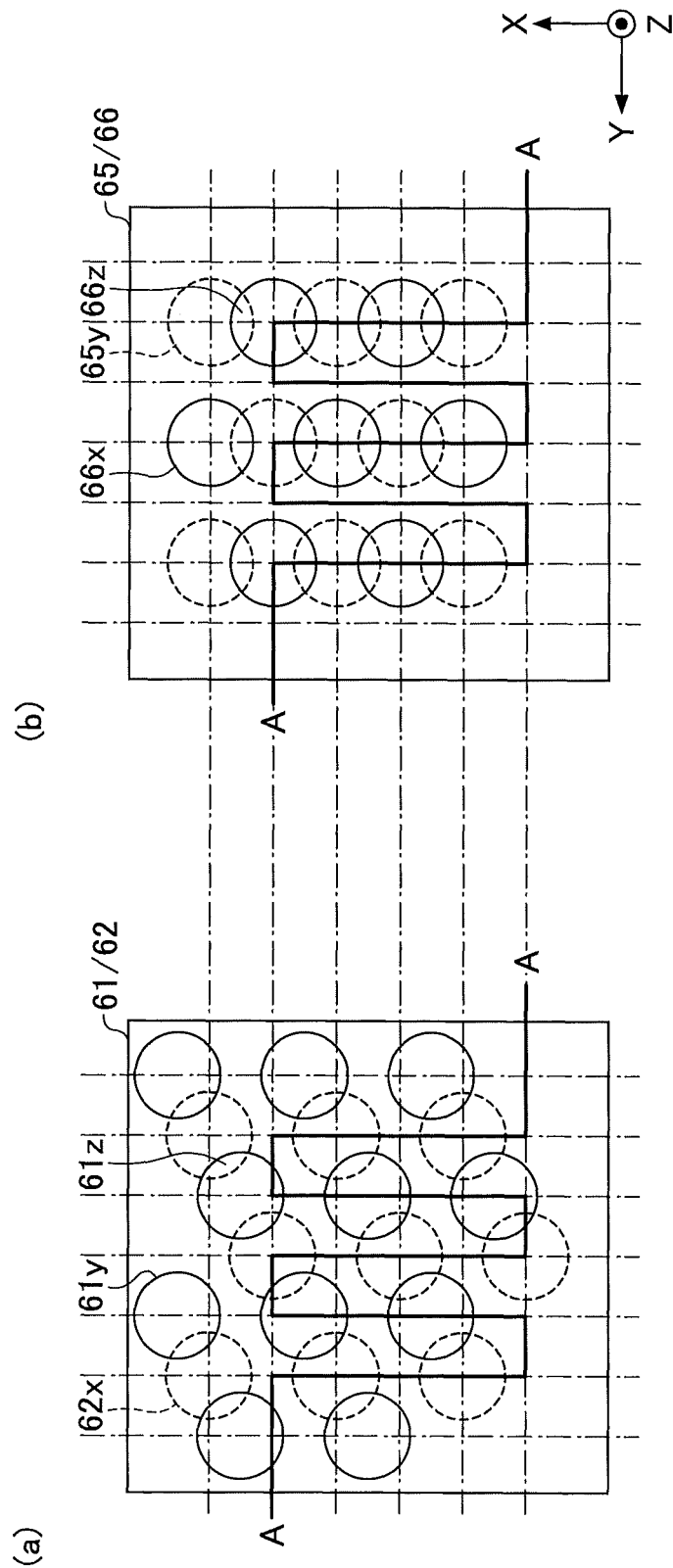
FIG. 8 is a plane view (No. 1) illustrating an example of a layout of bottomed holes at an interface of adjacent metal layers of the porous body.

FIG. 7 is a cross-sectional view (No. 2) illustrating a porous body 60A provided in the liquid line 40. FIG. 8 is a plane view (No. 1) illustrating an example of a layout of bottomed holes at each interface of adjacent metal layers. In FIG. 8, (a) illustrates an example of a layout of bottomed holes at an interface of the metal layer 61 and the metal layer 62, and (b) illustrates an example of a layout of bottomed holes at an interface of the metal layer 65 and the metal layer 66. Portions illustrated by A-A lines in FIG. 8 correspond to a cross-section of FIG. 7. The A-A line of FIG. 1 roughly illustrates the A-A lines of FIG. 8.

The porous body 60A illustrated in FIG. 7 and FIG. 8 has a structure, similarly as the porous body 60, in which the six metal layers 61 to 66 are stacked, and the structure of each of the metal layers 62 to 65 is the same as that of the porous body 60. However, the porous body 60A is different from the porous body 60 in that bottomed holes are formed in the first metal layer (first outermost layer) and the sixth metal layer 66 (second outermost layer) as well.

As illustrated in FIG. 7 and (a) of FIG. 8, a plurality of bottomed holes 61y each being formed to concave from a lower surface to a substantially center portion in the thickness direction are formed in the first metal layer 61.

When the metal layers 61 and 62 are seen in a planar view, a line in which the bottomed holes 61y are aligned in the X direction, and a line in which the bottomed holes 62x are aligned in the X direction are alternately aligned in the Y direction. Each of the bottomed holes 61y and each of the bottomed holes 62x in the lines alternately aligned and adjacent to each other in the Y direction partially overlap in a planar view, and overlapping portions are communicating with each other to form a pore 61z.

Here, centers of the adjacent bottomed hole 61y and the bottomed hole 62x that form the pore 61z are shifted in the X direction. In other words, the bottomed hole 61y and the bottomed hole 62x that form the pore 61z are alternately aligned in an oblique direction with respect to the X direction and the Y direction. The shape or the like of each of the bottomed holes 61y and the pores 61z may be the same as that of each of the bottomed holes 62x and the pores 62z, for example.

As illustrated in FIG. 7 and (b) of FIG. 8, a plurality of bottomed holes 66x each being formed to concave from an upper surface to a substantially center portion in the thickness direction are formed in the sixth metal layer 66.

When the metal layers 65 and 66 are seen in a planar view, the bottomed holes 66x and the bottomed holes 65y are alternately aligned in the X direction, in a planar view. Further, the bottomed holes 66x and the bottomed holes 65y are alternately aligned in the Y direction, in a planar view. Each of the bottomed holes 66x and each of the bottomed holes 65y alternately aligned and adjacent to each other in the X direction partially overlap in a planar view, and overlapping portions are communicating with each other to form a pore 66z. There is a predetermined space between each of the bottomed holes 66x and each of the bottomed holes 65y alternately aligned and adjacent to each other in the Y direction, and they do no overlap in a planar view. Thus, a pore is not formed between each of the bottomed holes 66x and each of the bottomed holes 65y alternately aligned and adjacent to each other in the Y direction. The shape or the like of each of the bottomed holes 66x and the pores 66z may be, for example, the same as that of each of the bottomed holes 62x and the pores 62z.

As such, in the porous body 60A, the bottomed holes 61y are formed in the metal layer 61, which is the first outermost layer, only at a surface that contacts the metal layer 62, and the pore 61z is provided by partially communicating each of the bottomed holes 61y and each of the bottomed holes 62x formed in the metal layer 62. Further, the bottomed holes 66x are formed in the metal layer 66, which is the second outermost layer, only at a surface that contacts the metal layer 65, and the pore 66z is provided by partially communicating each of the bottomed holes 66x and each of the bottomed holes 65y formed in the metal layer 65.

With this, it is possible to increase the number of pores of the porous body 60A compared with that of the porous body 60, and capillary force generated by the pores can be furthermore improved. As a result, an effect of suppressing the backflow of the vapor Cv from the evaporator 10 to the liquid line 40 can be furthermore increased.

As the pores 61z and 66z are formed between metal layers, by the different metal layers, similar to the conventional structure, sizes of the pores may not be uniform. However, basic capillary force is already sufficiently retained by the pores formed in each of the metal layers 62 to 65, and the pores 61z and 66z just add additional capillary force. Thus, a problem such as capillary force is insufficient, that occurs for the conventional structure, does not occur.

Second Embodiment

In a second embodiment, an example in which pores are also formed at an interface of adjacent metal layers is described. In the second embodiment, the same components are given the same reference numerals as the above described embodiment, and explanations are not repeated.

Figure 9:
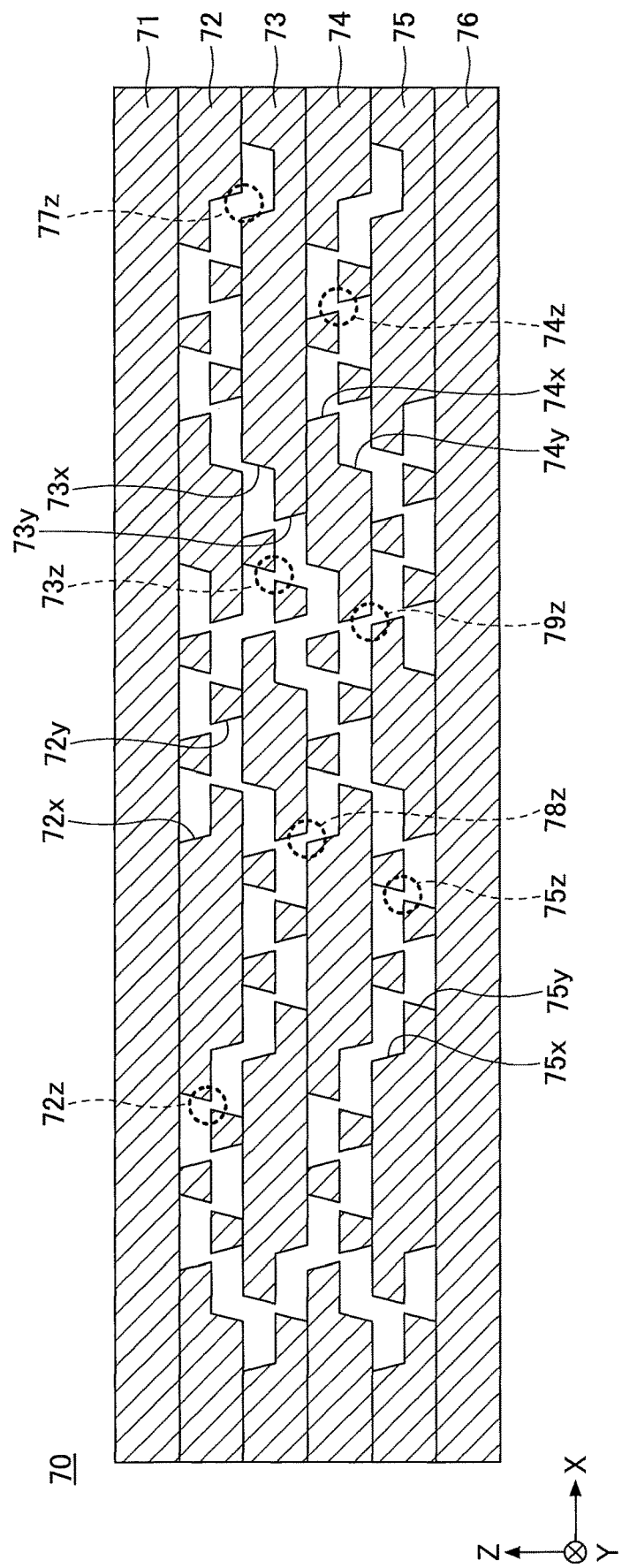
FIG. 9 is a cross-sectional view (No. 3) illustrating an example of the porous body provided in the liquid line.
Figure 10:
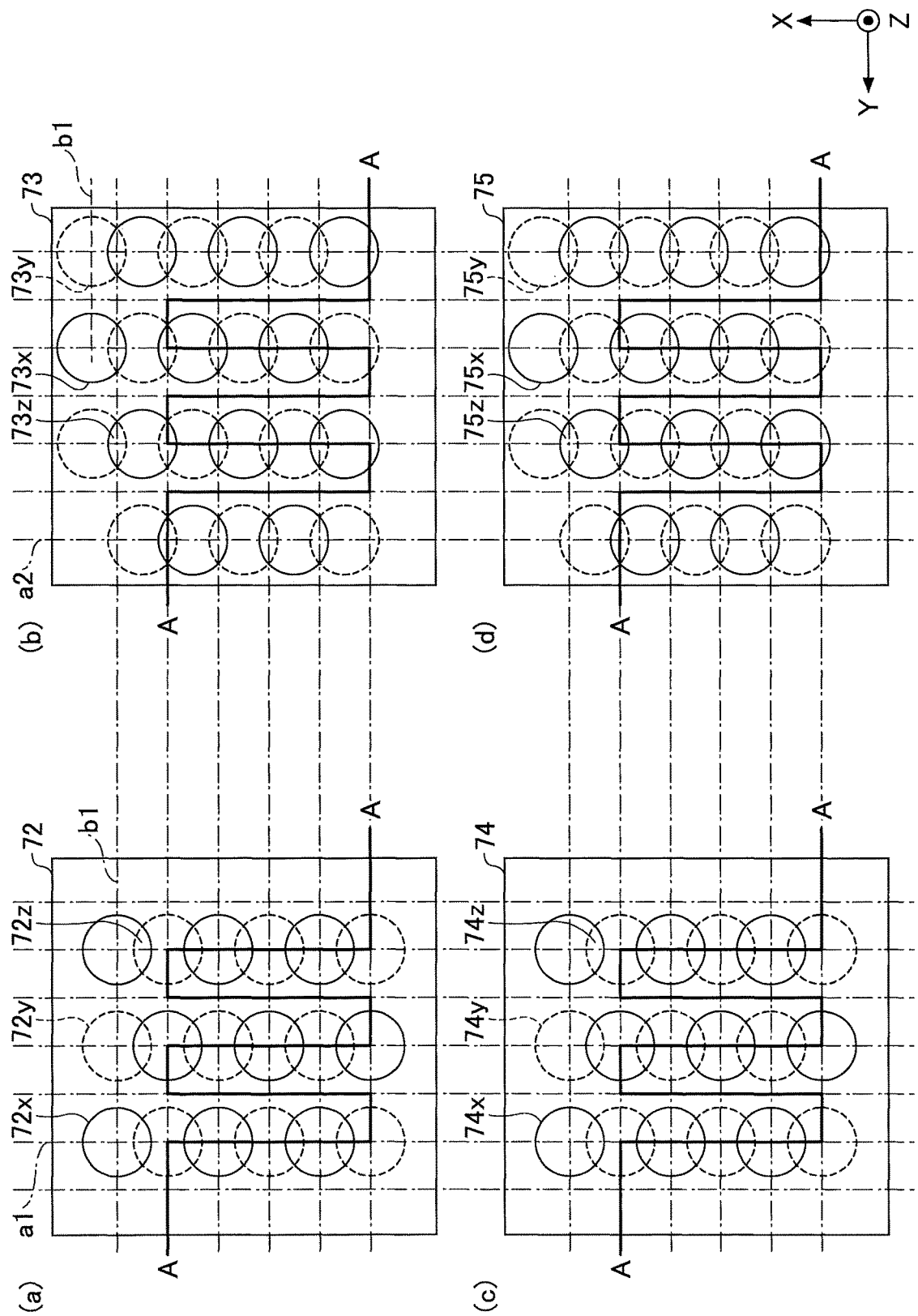
FIG. 10 is a plane view (No. 2) illustrating an example of a layout of bottomed holes in each of the second to fifth metal layers of the porous body.
Figure 11:
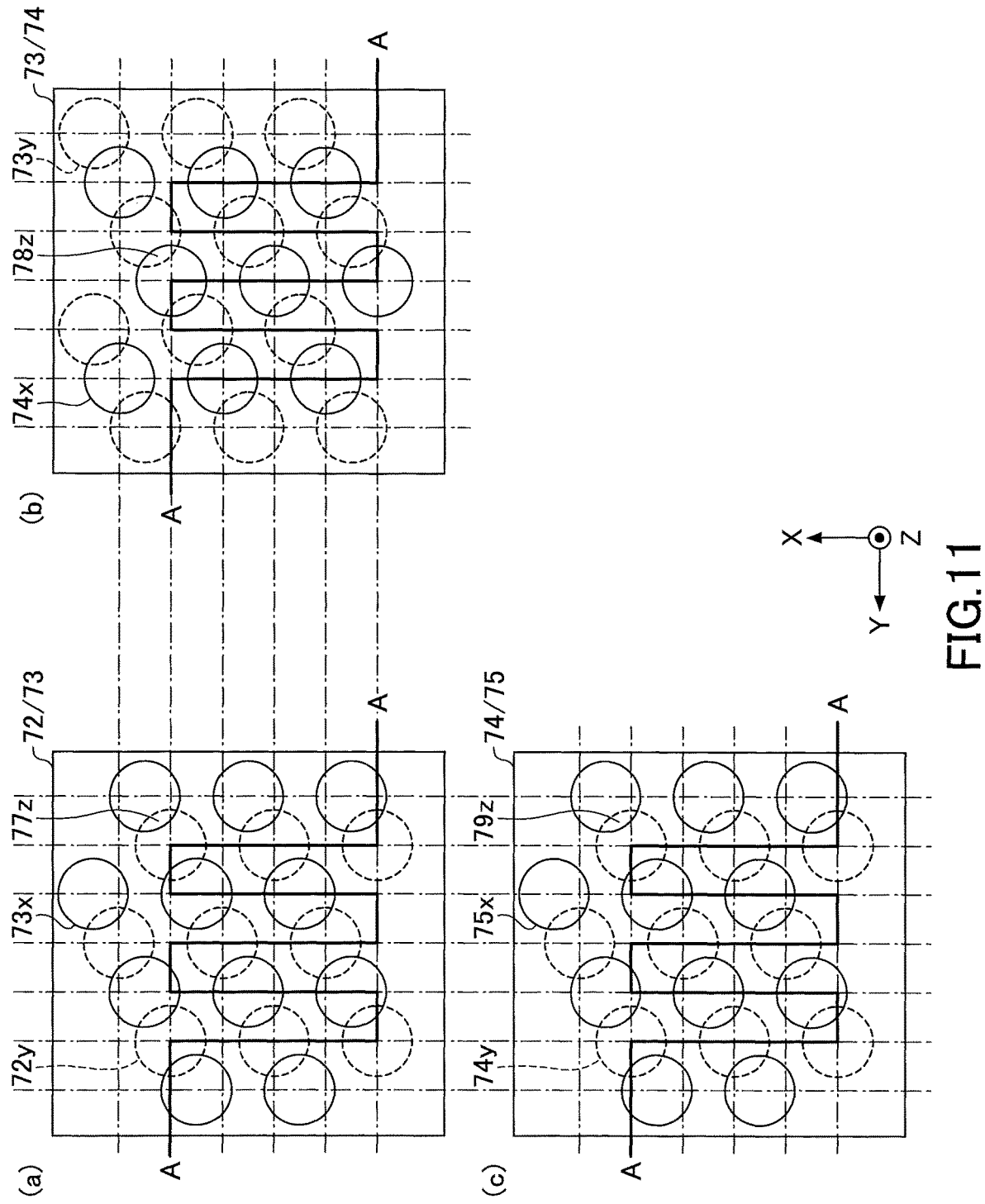
FIG. 11 is a plane view (No. 2) illustrating an example of a layout of bottomed holes at an interface of adjacent metal layers of the porous body.

FIG. 9 is a cross-sectional view (No. 3) illustrating an example of a porous body 70 provided in the liquid line 40. FIG. 10 is a plane view (No. 2) illustrating an example of a layout of bottomed holes in each of second to fifth metal layers. FIG. 11 is a plane view (No. 2) illustrating an example of a layout of bottomed holes at an interface of adjacent metal layers.

In FIG. 10, (a) illustrates an example of a layout of bottomed holes formed in a second metal layer 72, (b) illustrates an example of a layout of bottomed holes formed in a third metal layer 73, (c) illustrates an example of a layout of bottomed holes formed in a fourth metal layer 74, and (d) illustrates an example of a layout of bottomed holes formed in a fifth metal layer 75. In FIG. 11, (a) illustrates a layout of bottomed holes at an interface of the metal layer 72 and the metal layer 73, (b) illustrates a layout of bottomed holes at an interface of the metal layer 73 and the metal layer 74, and (c) illustrates a layout of bottomed holes at an interface of the metal layer 74 and the metal layer 75. Portions illustrated by A-A lines in FIG. 10 and FIG. 11 correspond to a cross-section of FIG. 9. The A-A line of FIG. 1 roughly illustrates the A-A lines of FIG. 10 and FIG. 11.

As illustrated in FIG. 9, the porous body 70 may have a structure in which, for example, six metal layers, first to sixth metal layers 71 to 76 are stacked. The material, the thickness, the method of bonding the metal layers 71 to 76 and the like are the same as those of the metal layers 61 to 66. The size of each of bottomed holes and pores formed in the metal layers 72 to 75 may be the same as that of each of the bottomed holes and the pores of the metal layers 62 to 65.

In the porous body 70, holes or grooves are not provided in each of the first metal layer 71 (first outermost layer) and the sixth metal layer 76 (second outermost layer).

On the other hand, as illustrated in FIG. 9 and (a) of FIG. 10, a plurality of bottomed holes 72x each being formed to concave from an upper surface to a substantially center portion in the thickness direction, and a plurality of bottomed holes 72y each being formed to concave from a lower surface to the substantially center portion in the thickness direction are formed in the second metal layer 72.

The positional relationship of the bottomed holes 72x and the bottomed holes 72y is the same as that of the bottomed holes 62x and the bottomed holes 62y (see (a) of FIG. 4). This means that each of the bottomed holes 72x and each of the bottomed holes 72y alternately aligned and adjacent to each other in the X direction partially overlap in a planar view, and overlapping portions are communicating with each other to form a pore 72z. There is a predetermined space between each of the bottomed holes 72x and each of the bottomed holes 72y alternately aligned and adjacent to each other in the Y direction, and they do not overlap in a planar view. Thus, a pore is not formed between each of the bottomed holes 72x and each of the bottomed holes 72y alternately aligned and adjacent to each other in the Y direction.

As illustrated in (b) of FIG. 10, a plurality of bottomed holes 73x each being formed to concave from an upper surface to a substantially center portion in the thickness direction, and a plurality of bottomed holes 73y each being formed to concave from a lower surface to the substantially center portion in the thickness direction are formed in the third metal layer 73.

The bottomed holes 73x and the bottomed holes 73y are alternately aligned in the X direction, in a planar view. Furthermore, the bottomed holes 73x and the bottomed holes 73y are alternately aligned in the Y direction, in a planar view. Each of the bottomed holes 73x and each of the bottomed holes 73y alternately aligned and adjacent to each other in the X direction partially overlap in a planar view, and overlapping portions are communicating with each other to form a pore 73z. There is a predetermined space between each of the bottomed holes 73x and each of the bottomed holes 73y alternately aligned and adjacent to each other in the Y direction, and they do not overlap in a planar view. Thus, a pore is not formed between each of the bottomed holes 73x and each of the bottomed holes 73y alternately aligned and adjacent to each other in the Y direction.

Here, a line ("a1" in (a) of FIG. 10) connecting centers of the bottomed hole 72x and the bottomed hole 72y alternately aligned in the X direction in the metal layer 72, and a line ("a2" in (b) of FIG. 10) connecting centers of the bottomed hole 73x and the bottomed hole 73y alternately aligned in the X direction in the metal layer 73 are shifted in the approximately Y direction for a half of the diameter of each hole, in a planar view. Further, a line ("b1" in (a) of FIG. 10) connecting centers of the bottomed hole 72x and the bottomed hole 72y alternately aligned in the Y direction in the metal layer 72, and a line ("b2" in (b) of FIG. 10) connecting centers of the bottomed hole 73x and the bottomed hole 73y alternately aligned in the Y direction in the metal layer 73 are shifted in the approximately X direction for a half of the diameter of each hole, in a planar view.

Thus, as illustrated in (a) of FIG. 11, each of the bottomed holes 72y and each of the bottomed holes 73x partially overlap at an interface of the metal layer 72 and the metal layer 73, in a planar view, and overlapping portions are communicating with each other to form a pore 77z. The bottomed hole 72y and the bottomed hole 73x that form the pore 77z are alternately aligned in an oblique direction with respect to the X direction and the Y direction.

As illustrated in FIG. 9 and (c) of FIG. 10, a plurality of bottomed holes 74x each being formed to concave from an upper surface to a substantially center portion in the thickness direction and a plurality of bottomed holes 74y each being formed to concave from a lower surface to the substantially center portion in the thickness direction are formed in the fourth metal layer 74.

The positional relationship of the bottomed holes 74x and the bottomed holes 74y is the same as that of the bottomed holes 72x and the bottomed holes 72y (see (a) of FIG. 10). This means that each of the bottomed holes 74x and each of the bottomed holes 74y alternately aligned and adjacent to each other in the X direction partially overlap in a planar view, and overlapping portions are communicating with each other to form a pore 74z. There is a predetermined space between each of the bottomed holes 74x and each of the bottomed holes 74y alternately aligned and adjacent to each other in the Y direction, and they do not overlap in a planar view. Thus, a pore is not formed between each of the bottomed holes 74x and each of the bottomed holes 74y alternately aligned and adjacent to each other in the Y direction.

As illustrated in (b) of FIG. 11, each of the bottomed holes 73y and each of the bottomed holes 74x partially overlap at an interface of the metal layer 73 and the metal layer 74, in a planar view, and overlapping portions are communicating with each other to form a pore 78z. The bottomed hole 73y and the bottomed hole 74x that form the pore 78z are alternately aligned in an oblique direction with respect to the X direction and the Y direction.

As illustrated in (d) of FIG. 10, a plurality of bottomed holes 75x each being formed to concave from an upper surface to a substantially center portion in the thickness direction, and a plurality of bottomed holes 75y each being formed to concave from a lower surface to the substantially center portion in the thickness direction are formed in the fifth metal layer 75.

The positional relationship of the bottomed holes 75x and the bottomed holes 75y is the same as that of the bottomed holes 73x and the bottomed holes 73y (see (b) of FIG. 10). This means that each of the bottomed holes 75x and each of the bottomed holes 75y alternately aligned and adjacent to each other in the X direction partially overlap in a planar view, and overlapping portions are communicating with each other to form a pore 75z. There is a predetermined space between each of the bottomed holes 75x and each of the bottomed holes 75y alternately aligned and adjacent to each other in the Y direction, and they do not overlap in a planar view. Thus, a pore is not formed between each of the bottomed holes 75x and each of the bottomed holes 75y alternately aligned and adjacent to each other in the Y direction.

As illustrated in (c) of FIG. 11, each of the bottomed holes 74y and each of the bottomed holes 75x partially overlap at an interface of the metal layer 74 and the metal layer 75, in a planar view, and overlapping portions are communicating with each other to form a pore 79z. The bottomed hole 74y and the bottomed hole 75x that form the pore 79z are alternately aligned in an oblique direction with respect to the X direction and the Y direction.

As such, in the porous body 70, the pores are provided at each of the interfaces of the adjacent metal layers in the metal layers 72 to 75.

With this, it is possible to increase the number of pores of the porous body 70 compared with that of the porous body 60, and capillary force generated by the pores can be furthermore improved. As a result, an effect of suppressing the backflow of the vapor Cv from the evaporator 10 to the liquid line 40 can be furthermore increased.

Here, similar to the conventional structure, sizes of the pores provided at the interface of the adjacent metal layers may not be uniform. However, basic capillary force is already sufficiently retained by the pores formed in each of the metal layers 72 to 75, and the pores provided at the interface of the adjacent metal layers just add additional capillary force. Thus, a problem such as capillary force is insufficient, that occurs for the conventional structure, does not occur.

(Alternative Example 1 of Second Embodiment)

In an alternative example 1 of the second embodiment, an example is described in which bottomed holes are also formed in the outermost layers of the porous body of the second embodiment. In the alternative example 1 of the second embodiment, the same components are given the same reference numerals as the above described embodiment, and explanations are not repeated.

Figure 12:
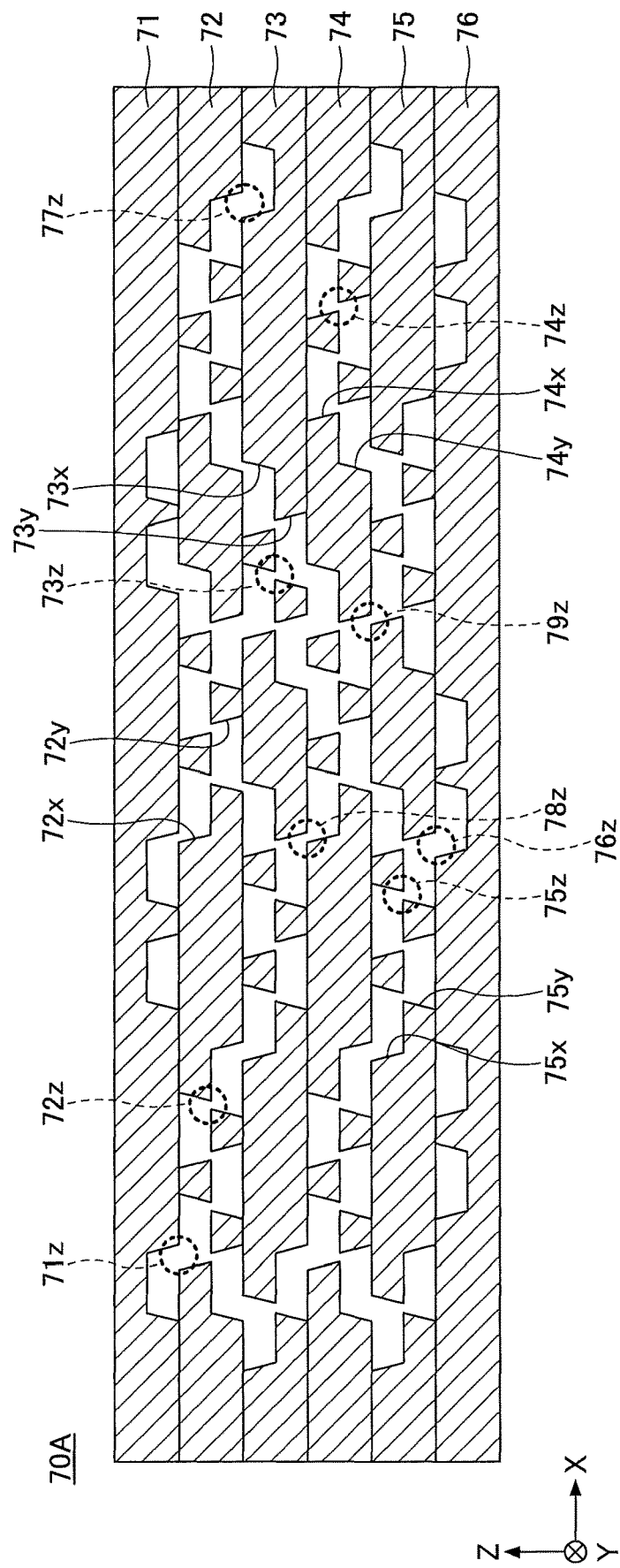
FIG. 12 is a cross-sectional view (No. 4) illustrating an example of the porous body provided in the liquid line.
Figure 13:
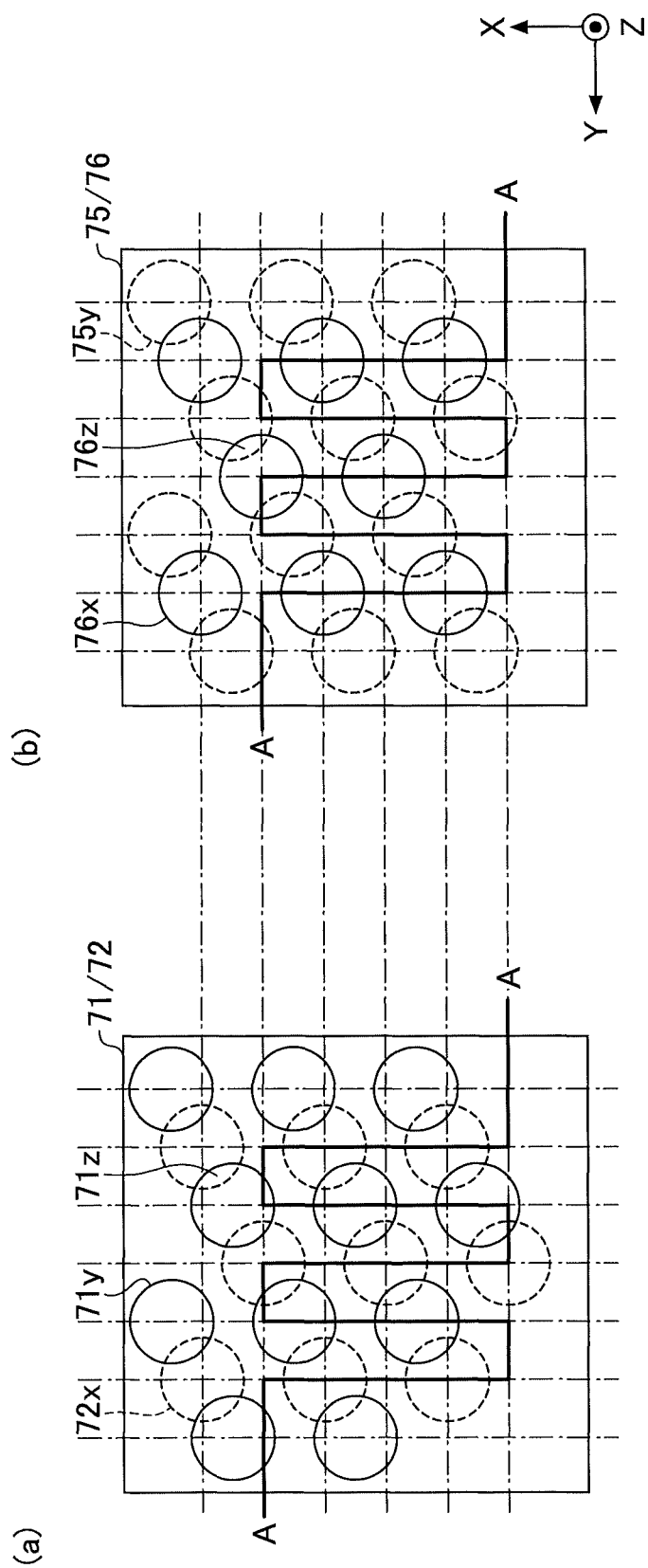
FIG. 13 is a plane view (No. 3) illustrating an example of a layout of bottomed holes at an interface of adjacent metal layers of the porous body.

FIG. 12 is a cross-sectional view (No. 4) illustrating an example of a porous body 70A provided in the liquid line 40. FIG. 13 is a plane view (No. 3) illustrating an example of a layout of bottomed holes at each interface of adjacent metal layers. In FIG. 13, (a) illustrates a layout of bottomed holes at an interface of the metal layer 71 and the metal layer 72, and (b) illustrates a layout of bottomed holes of an interface of the metal layer 75 and the metal layer 76. Portions illustrated by A-A lines in FIG. 13 correspond to a cross-section of FIG. 12. The A-A line of FIG. 1 roughly illustrates the A-A lines of FIG. 13.

The porous body 70A illustrated in FIG. 12 and FIG. 13 has a structure, similarly as the porous body 70, in which the six metal layers 71 to 76 are stacked, and the structure of each of the metal layers 72 to 75 is the same as that of the porous body 70. However, the porous body 70A is different from the porous body 70 in that bottomed holes are formed in the first metal layer (first outermost layer) and the sixth metal layer 76 (second outermost layer) as well.

As illustrated in FIG. 12 and (a) of FIG. 13, a plurality of bottomed holes 71y each being formed to concave from a lower surface to a substantially center portion in the thickness direction are formed in the first metal layer 71. The positional relationship of the bottomed holes 71y and the bottomed holes 72x is the same as that of the bottomed holes 61y and the bottomed holes 62x (see (a) of FIG. 8). Each of the bottomed holes 71y and each of the bottomed holes 72x partially overlap in a planar view, and overlapping portions are communicating with each other to form a pore 71z.

As illustrated in FIG. 12 and (b) of FIG. 13, a plurality of bottomed holes 76x each being formed to concave from an upper surface to a substantially center portion in the thickness direction are formed in the sixth metal layer 76.

When the metal layers 75 and 76 are seen in a planar view, a line in which the bottomed holes 75y are aligned in the X direction, and a line in which the bottomed holes 76x are aligned in the X direction are alternately aligned in the Y direction. Each of the bottomed holes 75y and each of the bottomed holes 76x in the lines alternately aligned and adjacent to each other in the Y direction partially overlap in a planar view, and overlapping portions are communicating with each other to form a pore 76z.

Here, centers of the adjacent bottomed hole 75y and the bottomed hole 76x that form the pore 76z are shifted in the X direction. In other words, the bottomed hole 75y and the bottomed hole 76x that form the pore 76z are alternately aligned in an oblique direction with respect to the X direction and the Y direction.

As such, in the porous body 70A, the bottomed holes 71y are formed in the metal layer 71, which is the first outermost layer, only at a surface that contacts the metal layer 72, and the pore 71z is provided by partially communicating each of the bottomed holes 71y and each of the bottomed holes 72x formed in the metal layer 72. Further, the bottomed holes 76x are formed in the metal layer 76, which is the second outermost layer, only at a surface that contacts the metal layer 75, and the pore 76z is provided by partially communicating each of the bottomed holes 76x and each of the bottomed holes 75y formed in the metal layer 75.

With this, it is possible to increase the number of pores of the porous body 70A compared with that of the porous body 70, and capillary force generated by the pores can be furthermore improved. As a result, an effect of suppressing the backflow of the vapor Cv from the evaporator 10 to the liquid line 40 can be furthermore increased.

As the pores 71z and 76z are formed between metal layers, by the different metal layers, similar to the conventional structure, sizes of the pores may not be uniform. However, basic capillary force is already sufficiently retained by the pores formed in each of the metal layers 72 to 75, and the pores 71z and 76z just add additional capillary force. Thus, a problem such as capillary force is insufficient, that occurs for the conventional structure, does not occur.

(Alternative Example 1 of First and Second Embodiments)

In an alternative example 1 of the first and second embodiments, an example is described in which the porous body includes bottomed holes of different sizes. In the alternative example 1 of the first and second embodiments, the same components are given the same reference numerals as the above described embodiment, and explanations are not repeated.

Figure 14:
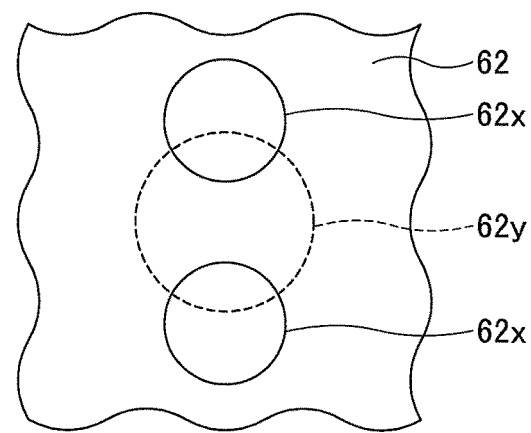
FIG. 14 is a view illustrating an example in which bottomed holes of different sizes are provided in a single metal layer.

FIG. 14 is a view illustrating an example in which bottomed holes of different sizes are provided in a single metal layer. As illustrated in FIG. 14, for example, the size of the bottomed hole 62y may be larger than that of the bottomed hole 62x in the metal layer 62. Alternatively, the size of the bottomed hole 62y may be smaller than that of the bottomed hole 62x. Further, in the adjacent metal layers, the bottomed hole in one of the metal layers may be different from the bottomed hole in the other of the metal layers. For example, the size of the bottomed hole 62y in the metal layer 62 may be different from that of the bottomed hole 63x in the metal layer 63.

As such, by changing the sizes of the bottomed holes that are adjacent in a vertical direction (Z direction), the sizes of the pores formed by the bottomed holes that are adjacent in the vertical direction may be changed. Thus, capillary force that is applied from the porous body 60 to the working fluid C can be adjusted.

Figure 15:
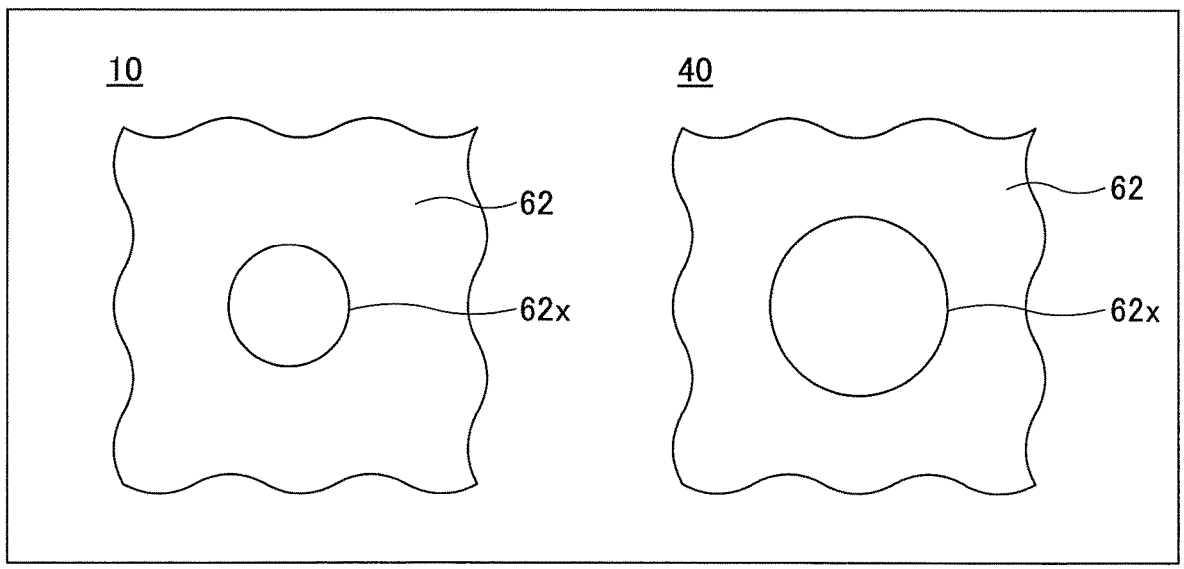
FIG. 15 is a view illustrating an example in which bottomed holes of different sizes are provided in a porous body in the evaporator and a porous body in the liquid line.

FIG. 15 is a view illustrating an example in which bottomed holes of different sizes are provided in a porous body in the evaporator and a porous body in the liquid line. As illustrated in FIG. 15, for example, the size of the bottomed hole 62x in the metal layer 62 in the evaporator 10 may be different from that of the bottomed hole 62x in the metal layer 62 in the liquid line 40.

For example, the size of the bottomed hole 62x in the metal layer 62 in the evaporator 10 may be smaller than that of the bottomed hole 62x in the metal layer 62 in the liquid line 40. With this, the working fluid C can smoothly flow in the large bottomed holes 62x in the liquid line 40 so that the working fluid C can be rapidly moved to the evaporator 10. Then, the liquid phase working fluid C can function as a check valve by capillary force generated by the small bottomed holes 62x in the evaporator 10 to effectively suppress the backflow of the vapor Cv.

Although the porous body 60 is exemplified in this example, this is the same for each of the porous bodies 60A, 70 and 70A.

According to the disclosure, a loop heat pipe including a porous body whose capillary force generated by pores is improved can be provided.

Although a preferred embodiment of the loop heat pipe has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, layouts of the bottomed holes are not limited to the above described embodiments (plane views), and may be desirably changed.

Various aspects of the subject-matter described herein are set out non-exhaustively in the following numbered clauses:

1. A method of manufacturing a loop heat pipe that includes
   an evaporator that vaporizes working fluid,
   a condenser that condenses the working fluid,
   a liquid line that connects the evaporator and the condenser,
   a vapor line that connects the evaporator and the condenser to form a loop with the liquid line, and
   a porous body provided in the liquid line or in the evaporator,
   the method comprising:
   a step of forming the porous body including a step of forming a first metal layer constituting the porous body,
   the step of forming the first metal layer including
      forming a first bottomed hole in a first metal sheet by half-etching the first metal sheet from one surface, and
      forming a second bottomed hole in the first metal sheet by half-etching the first metal sheet from another surface such that the second bottomed hole and the first bottomed hole partially communicate with each other to form a pore, the other surface being opposite of the one surface.

2. The method of manufacturing the loop heat pipe according to clause 1,
   wherein the step of forming the porous body further includes a step of forming a second metal layer constituting the porous body that is adjacent to the first metal layer,
   the step of forming the second metal layer including
      forming a third bottomed hole in a second metal sheet by half-etching the second metal sheet from one surface, and
      forming a fourth bottomed hole in the second metal sheet by half-etching the second metal sheet from another surface such that the third bottomed hole and the fourth bottomed hole partially communicate with each other to form a pore, the other surface being opposite of the one surface, and
   wherein the second bottomed hole of the first metal layer and the third bottomed hole of the second metal layer partially communicate with each other to form a pore.

3. The method of manufacturing the loop heat pipe according to clause 1,
   wherein the step of forming the porous body further includes a step of forming a second metal layer constituting the porous body that is adjacent to the first metal layer,
   the step of forming the second metal layer including
      forming a third bottomed hole in a second metal sheet by half-etching the second metal sheet from one surface, and
      forming a fourth bottomed hole in the second metal sheet by half-etching the second metal sheet from another surface such that the third bottomed hole and the fourth bottomed hole partially communicate with each other to form a pore, the other surface being opposite of the one surface, and
   wherein the second bottomed hole of the first metal layer and the third bottomed hole of the second metal layer are formed to overlap with each other in a planar view.

4. The method of manufacturing the loop heat pipe according to any one of clauses 1 to 3,
   wherein the step of forming the porous body further includes a step of forming a first outermost metal layer of the porous body that is stacked on the one surface of the first metal layer by forming a fifth bottomed hole in a third metal sheet by half-etching the third metal sheet from a surface of the third metal sheet that contacts the one surface of the first metal layer, and
   wherein the fifth bottomed hole and the first bottomed hole of the first metal layer partially communicate with each other to form a pore.

5. The method of manufacturing the loop heat pipe according to clause 4,
   wherein the step of forming the porous body further includes a step of forming a second outermost metal layer that is provided at opposite of the first outermost metal layer in the porous body, by forming a sixth bottomed hole in a fourth metal sheet by half-etching the fourth metal sheet from a surface of the fourth metal sheet that contacts an adjacent metal layer of the porous body, and
   wherein the sixth bottomed hole and a bottomed hole that is formed in the adjacent metal layer at a surface that contacts the second outermost metal layer partially communicate with each other to form a pore.

What is claimed is:

1. A loop heat pipe comprising:
   an evaporator that vaporizes working fluid;
   a condenser that condenses the working fluid;
   a liquid line that connects the evaporator and the condenser;
   a vapor line that connects the evaporator and the condenser to form a loop with the liquid line; and
   a porous body provided in the liquid line, and including a plurality of metal layers stacked one over another and bonded together, each of the metal layers being formed by etching a unitary metal sheet from two opposing surfaces, a first metal layer among the plurality of metal layers including
      a first hole that is recessed from one surface of the first metal layer, the first hole having a bottom surface, the first hole having a bottom-side region of an inner surface thereof and an opening-side region of the inner surface thereof, and
      a second hole that is recessed from another surface of the first metal layer, the other surface being opposite of the one surface, the second hole having a bottom surface, the second hole having a bottom-side region of an inner surface thereof and an opening-side region of the inner surface thereof, the bottom surface of the first hole and the bottom surface of the second hole partially overlapping each other as viewed in a thickness direction of the metal layers to communicate with each other to form a pore,
   wherein a width of the first hole at the opening-side region of the inner surface of the first hole is larger than a width of the first hole at the bottom-side region of the inner surface of the first hole, and a width of the second hole at the opening-side region of the inner surface of the second hole is larger than a width of the second hole at the bottom-side region of the inner surface of the second hole, and
   wherein in the first metal layer, the opening-side region of the inner surface of the first hole and the opening-side region of the inner surface of the second hole are positioned off center from each other as viewed in the thickness direction of the metal layers.

2. The loop heat pipe according to claim 1,
wherein the porous body further includes a second metal layer that includes
   a third hole that is recessed from one surface of the second metal layer, the third hole having a bottom surface, and
   a fourth hole that is recessed from another surface of the second metal layer, the other surface being opposite of the one surface, the fourth hole having a bottom surface, the third hole and the fourth hole partially overlapping each other as viewed in the thickness direction of the metal layers to communicate with each other to form a pore, the one surface of the second metal layer being adjacent to the other surface of the first metal layer, and
wherein the second hole of the first metal layer and the third hole of the second metal layer partially overlap each other as viewed in the thickness direction of the metal layers to communicate with each other to form a pore.

3. The loop heat pipe according to claim 1,
wherein the porous body further includes a second metal layer that includes
   a third hole that is recessed from one surface of the second metal layer, the third hole having a bottom surface, and
   a fourth hole that is recessed from another surface of the second metal layer, the other surface being opposite of the one surface, the fourth hole having a bottom surface, the third hole and the fourth hole partially overlapping each other as viewed in the thickness direction of the metal layers to communicate with each other to form a pore, the one surface of the second metal layer being adjacent to the other surface of the first metal layer, and
wherein the second hole of the first metal layer and the third hole of the second metal layer are formed to overlap with each other as viewed in the thickness direction of the metal layers.

4. The loop heat pipe according to claim 1,
wherein the porous body further includes a first outermost metal layer that is stacked on the one surface of the first metal layer,
wherein the first outermost metal layer includes a fifth hole that is recessed from a surface of the first outermost metal layer that contacts the one surface of the first metal layer, the fifth hole having a bottom surface, and
wherein the fifth hole and the first hole of the first metal layer partially overlap each other as viewed in the thickness direction of the metal layers to communicate with each other to form a pore.

5. The loop heat pipe according to claim 4,
wherein the porous body further includes a second outermost metal layer that is provided at opposite of the first outermost metal layer in the porous body,
wherein the second outermost metal layer includes a sixth hole that is recessed from a surface of the second outermost metal layer that contacts an adjacent metal layer of the porous body, the sixth hole having a bottom surface, and
wherein the sixth hole and a hole that has a bottom surface and that is formed in the adjacent metal layer at a surface that contacts the second outermost metal layer partially overlap each other as viewed in the thickness direction of the metal layers to communicate with each other to form a pore.

6. A loop heat pipe comprising:
an evaporator that vaporizes working fluid;
a condenser that condenses the working fluid;
a liquid line that connects the evaporator and the condenser;
a vapor line that connects the evaporator and the condenser to form a loop with the liquid line; and
a porous body provided in the evaporator, and including a plurality of metal layers stacked one over another and bonded together, each of the metal layers being formed by etching a unitary metal sheet from two opposing surfaces, a first metal layer among the plurality of metal layers including
   a first hole that is recessed from one surface of the first metal layer, the first hole having a bottom surface, the first hole having a bottom-side region of an inner surface thereof and an opening-side region of the inner surface thereof, and
   a second hole that is recessed from another surface of the first metal layer, the other surface being opposite of the one surface, the second hole having a bottom surface, the second hole having a bottom-side region of an inner surface thereof and an opening-side region of the inner surface thereof, the bottom surface of the first hole and the bottom surface of the second hole partially overlapping each other as viewed in a thickness direction of the metal layers to communicate with each other to form a pore,
wherein a width of the first hole at the opening-side region of the inner surface of the first hole is larger than a width of the first hole at the bottom-side region of the inner surface of the first hole, and a width of the second hole at the opening-side region of the inner surface of the second hole is larger than a width of the second hole at the bottom-side region of the inner surface of the second hole, and
wherein in the first metal layer, the opening-side region of the inner surface of the first hole and the opening-side region of the inner surface of the second hole are positioned off center from each other as viewed in the thickness direction of the metal layers.

7. The loop heat pipe according to claim 6,
wherein the porous body further includes a second metal layer that includes
   a third hole that is recessed from one surface of the second metal layer, the third hole having a bottom surface, and
   a fourth hole that is recessed from another surface of the second metal layer, the other surface being opposite of the one surface, the fourth hole having a bottom surface, the third hole and the fourth hole partially overlapping each other as viewed in the thickness direction of the metal layers to communicate with each other to form a pore, the one surface of the second metal layer being adjacent to the other surface of the first metal layer, and
wherein the second hole of the first metal layer and the third hole of the second metal layer partially overlap each other as viewed in the thickness direction of the metal layers to communicate with each other to form a pore.

8. The loop heat pipe according to claim 6,
wherein the porous body further includes a second metal layer that includes a third hole that is recessed from one surface of the second metal layer, the third hole having a bottom surface, and a fourth hole that is recessed from another surface of the second metal layer, the other surface being opposite of the one surface, the fourth hole having a bottom surface, the third hole and the fourth hole partially overlapping each other as viewed in the thickness direction of the metal layers to communicate with each other to form a pore, the one surface of the second metal layer being adjacent to the other surface of the first metal layer, and wherein the second hole of the first metal layer and the third hole of the second metal layer are formed to overlap with each other as viewed in the thickness direction of the metal layers.

9. The loop heat pipe according to claim 6, wherein the porous body further includes a first outermost metal layer that is stacked on the one surface of the first metal layer, wherein the first outermost metal layer includes a fifth hole that is recessed from a surface of the first outermost metal layer that contacts the one surface of the first metal layer, the fifth hole having a bottom surface, and wherein the fifth hole and the first hole of the first metal layer partially overlap each other as viewed in the thickness direction of the metal layers to communicate with each other to form a pore.

10. The loop heat pipe according to claim 9, wherein the porous body further includes a second outermost metal layer that is provided at opposite of the first outermost metal layer in the porous body, wherein the second outermost metal layer includes a sixth hole that is recessed from a surface of the second outermost metal layer that contacts an adjacent metal layer of the porous body, the sixth hole having a bottom surface, and wherein the sixth hole and a hole that has a bottom surface and that is formed in the adjacent metal layer at a surface that contacts the second outermost metal layer partially overlap each other as viewed in the thickness direction of the metal layers to communicate with each other to form a pore.

* * * * *